(12) United States Patent
Miyata et al.

(10) Patent No.: US 8,158,310 B2
(45) Date of Patent: Apr. 17, 2012

(54) ABERRATION EVALUATION PATTERN, ABERRATION EVALUATION METHOD, ABERRATION CORRECTION METHOD, ELECTRON BEAM DRAWING APPARATUS, ELECTRON MICROSCOPE, MASTER, STAMPER, RECORDING MEDIUM, AND STRUCTURE

(75) Inventors: Hiroyuki Miyata, Kanagawa (JP); Takeshi Miyazaki, Tokyo (JP); Kazuhiko Kobayashi, Tokyo (JP); Kunito Hayashi, Tokyo (JP)

(73) Assignees: Ricoh Company, Ltd., Tokyo (JP); Crestec Corporation, Tokyo (JP)

( * ) Notice: Subject to any disclaimer, the term of this patent is extended or adjusted under 35 U.S.C. 154(b) by 621 days.

(21) Appl. No.: 12/279,964

(22) PCT Filed: Dec. 27, 2007

(86) PCT No.: PCT/JP2007/075417
§ 371 (c)(1),
(2), (4) Date: Aug. 19, 2008

(87) PCT Pub. No.: WO2008/082000
PCT Pub. Date: Jul. 10, 2008

(65) Prior Publication Data
US 2010/0227200 A1 Sep. 9, 2010

(30) Foreign Application Priority Data

Dec. 29, 2006 (JP) ................................. 2006-356875
Nov. 27, 2007 (JP) ................................. 2007-306627

(51) Int. Cl.
*G03C 5/00* (2006.01)

(52) U.S. Cl. .......... 430/24; 430/21; 369/126; 369/53.28
(58) Field of Classification Search .................. 369/126, 369/53.28
See application file for complete search history.

(56) References Cited

U.S. PATENT DOCUMENTS

| 2003/0006371 A1 | 1/2003 | Watanabe et al. |
| 2003/0071230 A1 | 4/2003 | Wada |
| 2005/0035290 A1 | 2/2005 | Saitoh |

FOREIGN PATENT DOCUMENTS

| JP | 9-223476 | 8/1997 |
| JP | 09223476 A | * 8/1997 |

(Continued)

OTHER PUBLICATIONS

International Search Report for PCT/JP2007/075417 (Feb. 26, 2008).

(Continued)

*Primary Examiner* — Mark Ruthkosky
*Assistant Examiner* — Gary Harris
(74) *Attorney, Agent, or Firm* — Dickstein Shapiro LLP

(57) ABSTRACT

A method of evaluating astigmatism of an irradiation system irradiating an electron beam is disclosed. In this method, a figure pattern consisting of plural (for example, four) concentric circles is formed on a reference sample "WP" and an image (scanned image) is formed based on an electron signal obtained by scanning the electron beam onto the reference sample "WP". In the scanned image, the image has a blur in a region with its longitudinal direction parallel to the generating direction of the astigmatism and the size of the blur depends on magnitude of the astigmatism. Therefore, the direction and the magnitude of the astigmatism of the irradiation system of an irradiation apparatus can be detected based on the obtained scanned image.

5 Claims, 28 Drawing Sheets

FOREIGN PATENT DOCUMENTS

| | | |
|---|---|---|
| JP | 2001-085305 | 3/2001 |
| JP | 2001-110345 | 4/2001 |
| JP | 2003-007591 | 1/2003 |
| JP | 2003-016983 | 1/2003 |
| JP | 2003-123677 | 4/2003 |
| JP | 2003123677 A * | 4/2003 |
| JP | 2004-153245 | 5/2004 |
| JP | 2004-265652 | 9/2004 |
| JP | 2004265652 A * | 9/2004 |
| JP | 2005-063678 | 3/2005 |
| JP | 2005063678 A * | 3/2005 |
| JP | 2005-108567 | 4/2005 |
| JP | 2006-080201 | 3/2006 |

OTHER PUBLICATIONS

Written Opinion of the International Search Authority for PCT/JP2007/075417 (Feb. 26, 2008).

* cited by examiner

FIG.12A
UNDER FOCUS      OVER FOCUS
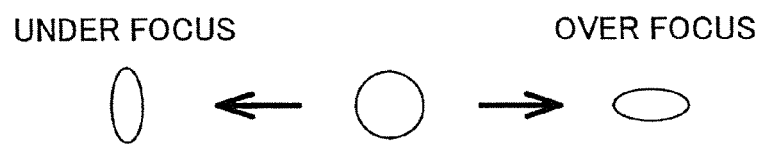
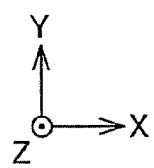
FIG.12B
UNDER FOCUS      OVER FOCUS
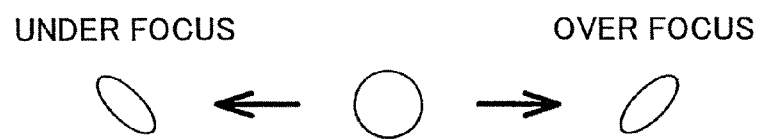
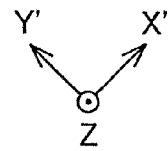

FIG.13A
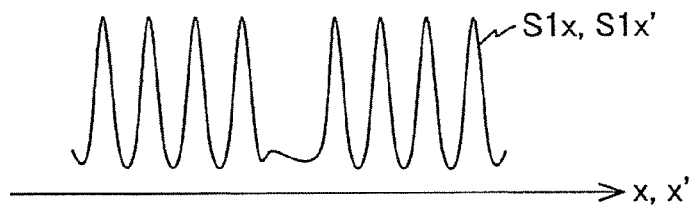
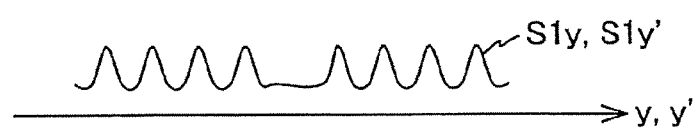
FIG.13B
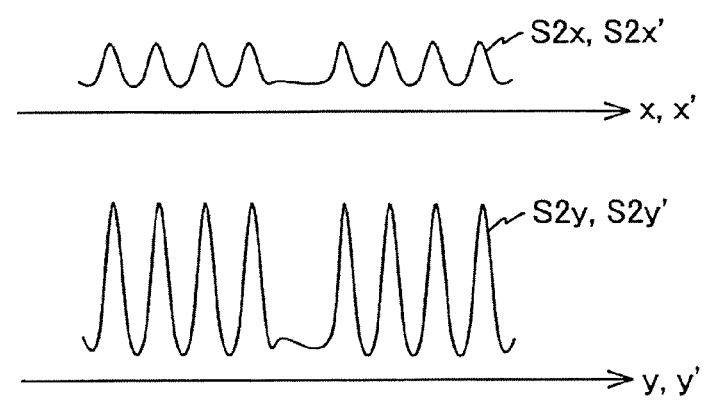
FIG.13C
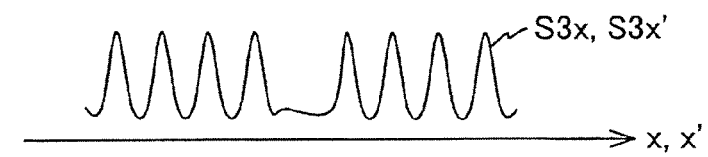
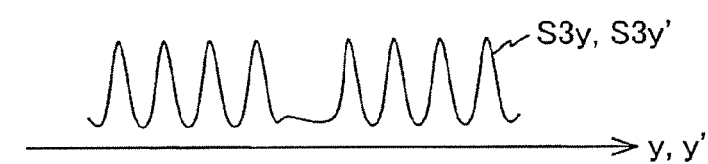

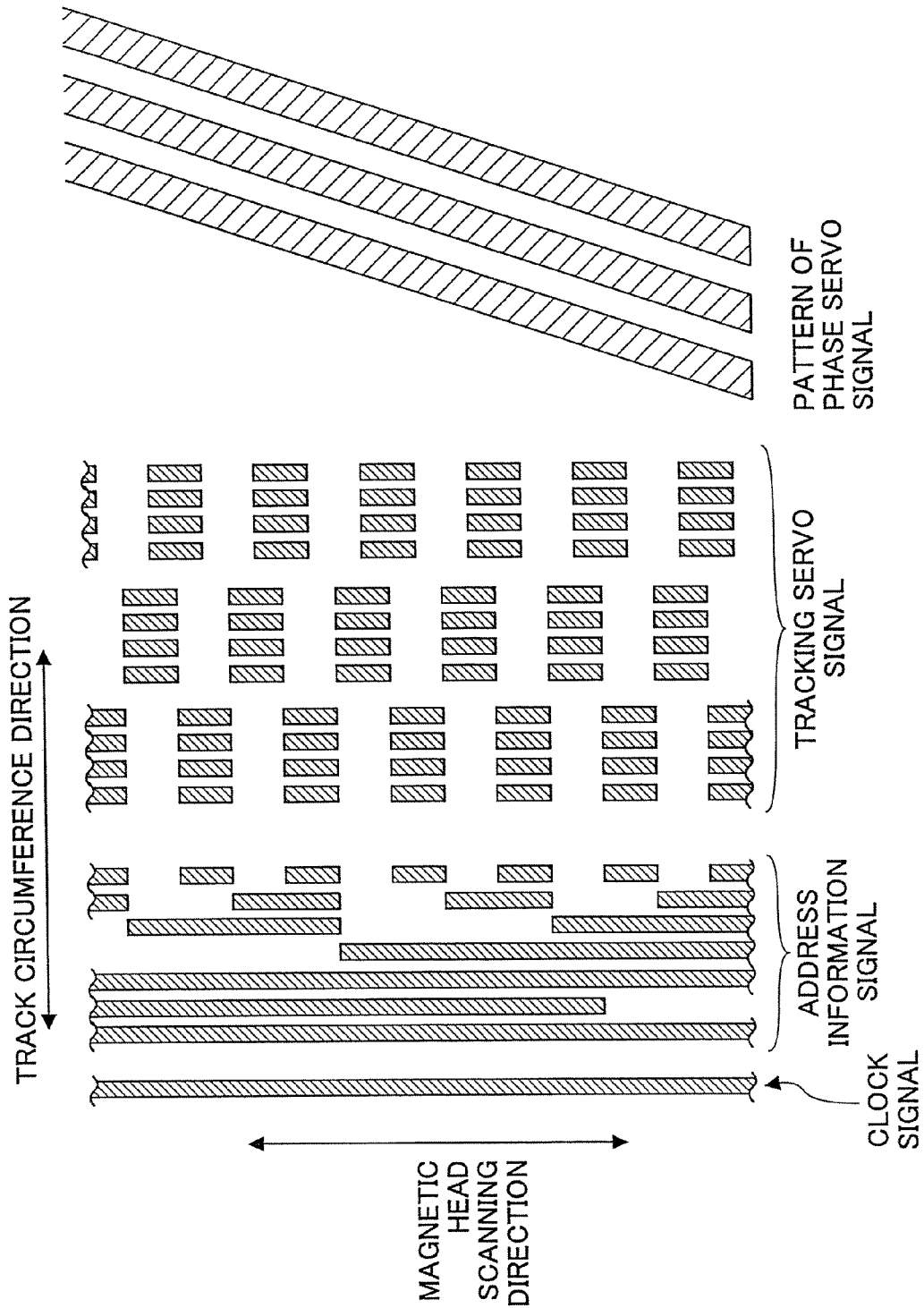

ABERRATION EVALUATION PATTERN, ABERRATION EVALUATION METHOD, ABERRATION CORRECTION METHOD, ELECTRON BEAM DRAWING APPARATUS, ELECTRON MICROSCOPE, MASTER, STAMPER, RECORDING MEDIUM, AND STRUCTURE

TECHNICAL FIELD

The present invention relates to an aberration evaluation pattern, an aberration evaluation method, an aberration correction method, an electron beam drawing apparatus, an electron microscope, a master, a stamper, a recording medium, and a structure, and more specifically, to an aberration evaluation pattern evaluating the aberration of an irradiation system scanning a surface of a sample, an aberration evaluation method evaluating the aberration of an irradiation system based on an electronic signal obtained by scanning the aberration evaluation pattern with an electron beam, an aberration correction method correcting the aberration of the irradiation system based on the evaluation result obtained by the aberration evaluation method, an electron beam drawing apparatus having an irradiation system whose aberration is corrected using the aberration correction method, an electron microscope having an irradiation system whose aberration is corrected using the aberration correction method, a master on which a pattern is drawn by using the electron beam drawing apparatus, a stamper manufactured by using the master, a recording medium manufactured by using the stamper, and a structure manufactured by using the stamper.

BACKGROUND ART

In the optical lithography technology field, conventionally research and development of the optical lithography technology using such as g-line, i-line, and KrF excimer lasers have been actively made. From the viewpoint of further downsizing and increase of capacity of semiconductor devices in the future, improvement and development of the lithography technologies utilizing such as an electron beam drawing apparatus using an electron beam capable of drawing fine patterns on a sample, and a scanning electron microscope (SEM) capable of observing such a fine pattern with high resolution are expected.

Generally, an apparatus using an electron beam has a focus adjustment function and an astigmatism correction function so as to downsize the spot shape of an electron beam emitted from an electron gun or an electron beam irradiation apparatus and to make the spot shape a perfect circle. The focus adjustment function is a function to downsize the spot shape of an electron beam formed on the surface of a sample as much as possible. The astigmatism correction function is a function to make the spot shape of an electron beam not an ellipse but an perfect circle.

Conventionally, to correct astigmatism, an image based on secondary electrons or backscattered electrons obtained by irradiating an electron beam onto a sample having a fine structure such as an Au or Pt evaporated sample and an etched sample having a hole shape is observed using the SEM function of an electron beam drawing apparatus. Then an adjustment is made by operating the astigmatism correction function so that the observed image can be seen more sharply. However, in this qualitative determination method, it is difficult to evaluate the existence, the direction, and the size of the astigmatism, and the operation of correcting astigmatism is performed manually. Therefore, there are problems that it requires time and reproducibility is poor. Also problematically, the result is likely to be influenced by an individual's learning characteristics throughout the operations. As a result, this method may be used for research and development, but there are many problems when used in an apparatus for production.

To address the problems, for example, as a technique as described in Patent Document 1 called the knife edge method, there is a proposed technique that, after the spot shape of an electron beam is directly measured, the astigmatism is corrected. However, the challenge is to manufacture a high-accuracy knife edge. Also, there is a problem that enough measurement accuracy (reproducibility) cannot be obtained due to, for example, scattered electrons. To address the problem, there is a proposed technique as described in Patent Document 2 that after a reference pattern having a fan-shaped radial pattern is formed (on a reticle in this case), the astigmatism is determined and corrected by detecting the defocusing direction and the defocusing amount of the electron beam image obtained by irradiating electron beams. However, there is no specific description given regarding the concrete procedure and the quantifying method of detecting the size and the direction of the astigmatism (including after the image is formed) except to note that the resolution of the image is observed. Further, there is a problem that it requires cumbersome procedures and time to make the reference pattern in which a fan-like pattern with the width of the pattern being changing continuously is radically and orderly formed.

Further, in a proposed technique described in Patent Document 3, a reference sample on which plural reference patterns each having a lattice structure made of lines and spaces are discretely disposed along a circumference of a circle or concentric circles so that the lattice direction (lines and spaces direction) is made into the radius direction is prepared, and an electron beam is scanned along the circle passing through the reference patterns to detect the amplitude of an electronic signal to determine and correct an out-of-focus state and the astigmatism. However, since it is necessary to dispose plural reference patterns each of the lattice directions different from others on the corresponding prescribed positions along the circumference, the problem is that it is very difficult to manufacture the reference sample. Further, it is also cumbersome to accurately scan an electron beam along a circumference of a circle or concentric circles. Still further, when the scanning radius of an electron beam is large, aberration due to deflection is disadvantageously added.

[Patent Document 1] Japanese Laid-Open Patent Application No. 2006-080201
[Patent Document 2] Japanese Laid-Open Patent Application No. 2004-153245
[Patent Document 3] Japanese Patent No. 3984019

DISCLOSURE OF THE INVENTION

Problems to be Solved by the Invention

The present invention is made in light of the above problems, and a first object of the present invention is to provide an aberration evaluation pattern capable of accurately evaluating the aberration of an irradiation system.

Further, a second object of the present invention is to provide an aberration evaluation method capable of accurately evaluating the aberration of an irradiation system.

Still further, a third object of the present invention is to provide an aberration correction method capable of accurately correcting the aberration of an irradiation system.

Still further, a fourth object of the present invention is to provide an electron beam drawing apparatus capable of accurately drawing a pattern onto a sample.

Still further, a fifth object of the present invention is to provide an electron microscope capable of accurately observing a sample.

Still further, a sixth object of the present invention is to provide a master capable of manufacturing a stamper on which a fine pattern is drawn.

Still further, a seventh object of the present invention is to provide a stamper capable of forming a fine pattern on a recording medium and a structure.

Still further, an eighth object of the present invention is to provide a recording medium and a structure on which a fine pattern is formed.

Means for Solving the Problems

According to a first aspect of the present invention, there is provided an aberration evaluation pattern for evaluating aberration of an irradiation system scanning an electron beam onto a surface of a sample by deflecting the electron beam. The aberration evaluation pattern includes a periodical structure having a prescribed line width and a prescribed distance between the lines, the periodical structure being provided on the same plane and formed outward from a center that is an irradiated position of the electron beam when the electron beam is not deflected, the periodical structure being formed to extend 360 degrees around the periphery of the center and has either a concentric-circle figure or a spiral figure whose center is positioned at the center that is the irradiated position of the electron beam when the electron beam is not deflected.

According to the aspect, the aberration evaluation pattern is a periodical structure provided on the same plane and has either a concentric-circle figure or a spiral figure whose center is positioned at the same center of the irradiated position of the electron beam that is not yet deflected. The periodical structure having a prescribed line width and a prescribed distance between the lines is formed to extend 360 degrees around the periphery of the center.

Therefore, it becomes possible to evaluate astigmatism at any position on the aberration evaluation pattern figure based on an image formed by an electron signal obtained by scanning the electron beam onto the aberration evaluation pattern figure.

According to a second aspect of the present invention, there is provided an aberration evaluation method for evaluating aberration of an irradiation system based on an image obtained by scanning an electronic beam onto an aberration evaluation pattern. The irradiation system irradiates an electron beam. The aberration evaluation method includes a step of scanning the electron beam onto the aberration evaluation pattern according to an embodiment of the present invention, a step of forming the image based on an electron signal obtained by the scanning, and a step of evaluating aberration of the irradiation system based on the image.

According to this aspect, the aberration of the irradiation system is evaluated based on an image obtained by scanning the electron beam onto the aberration evaluation pattern according to an embodiment of the present invention. Therefore, it becomes possible to evaluate astigmatism at any position on the aberration evaluation pattern.

According to a third aspect of the present invention, there is provided an aberration evaluation method for evaluating aberration of an irradiation system based on an image obtained by scanning an electronic beam onto an aberration evaluation pattern. The irradiation system irradiates an electron beam. The aberration evaluation method includes a step of setting a focus position of the irradiation system onto the aberration evaluation pattern according to an embodiment of the present invention, and a step of evaluating aberration of the irradiation system based on electron signals obtained by scanning the electron beam onto the aberration evaluation pattern onto which the focus position of the irradiation system is set in a first direction and a second direction orthogonal to the first direction.

According to this aspect, the aberration evaluation pattern onto which the focus position of the irradiation system is set includes a reference figure formed on the same plane with its center positioned at the irradiated position of the electron beam when the electron is not yet deflected, and plural similar figures formed with the reference figure positioned at the center. Those figures have a prescribed line width and a prescribed distance between the lines. Then the electron beam is deflected in arbitrary first and second directions, the first and the second directions being orthogonal to each other and the deflecting electron beam is scanned onto the aberration evaluation pattern to detect two electron signals corresponding to each of the directions. Therefore, it becomes possible to evaluate astigmatism in each direction by comparing each of the signals.

According to a fourth aspect of the present invention, there is provided an aberration correction method for correcting aberration of the irradiation system based on an evaluation result obtained by the aberration evaluation method according to an embodiment of the present invention.

According to this aspect, it becomes possible to reduce the influence of the astigmatism in the scanning region of the electron beam by forming the spot shape of the electron beam so that the waveforms of the two electron signals corresponding to the first and the second directions obtained by the aberration evaluation method according to an embodiment of the present invention becomes substantially similar to each other.

According to a fifth aspect of the present invention, there is provided an electron beam drawing apparatus including an irradiation system whose aberration is corrected by the aberration correction method according to an embodiment of the present invention. According to this aspect, since the aberration of the irradiation system included in the electron beam drawing apparatus is corrected by the aberration correction method according to an embodiment of the present invention, it becomes possible to accurately draw a pattern on a sample without being affected by the aberration of the irradiation system.

According to a sixth aspect of the present invention, there is provided an electron microscope including an irradiation system whose aberration is corrected by the aberration correction method according to an embodiment of the present invention. According to this aspect, since the aberration of the irradiation system included in the electron microscope is corrected by the aberration correction method according to an embodiment of the present invention, it becomes possible to accurately observe a sample without being affected by the aberration of the irradiation system.

According to a seventh aspect of the present invention, there is provided a master of an information recording medium on which a prescribed pattern is drawn by the electron beam drawing apparatus according to an embodiment of the present invention. According to this aspect, since a fine pattern is accurately drawn on the master, it becomes possible to accurately manufacture a stamper for forming a fine pattern onto, for example, a recording medium.

According to a eighth aspect of the present invention, there is provided a stamper of an information recording medium manufactured by using the master disk according to an embodiment of the present invention. According to this aspect, since a fine pattern is accurately drawn onto the stamper, it becomes possible to form (transfer) a high resolution pattern onto, for example, a recording medium.

According to a ninth aspect of the present invention, there is provided an optical information recording medium manufactured by using the stamper according to an embodiment of the present invention. According to this aspect, it becomes possible to improve the recording density.

According to a tenth aspect of the present invention, there is provided a structure manufactured by using a stamper according to an embodiment of the present invention. According to this aspect, it becomes possible to improve the recording density of a recording medium using this structure.

BRIEF DESCRIPTION OF THE DRAWINGS

FIGS. 12A and 12B are drawings (No. 1 and 2) showing the spot shapes of an electron beam corresponding to focus positions;

FIGS. 13A through 13C are drawings (No. 1 through 3) showing secondary electron signals corresponding to the spot shapes;

FIG. 23 is an enlarged drawing of the area shown in FIG. 22;

Figure 1:
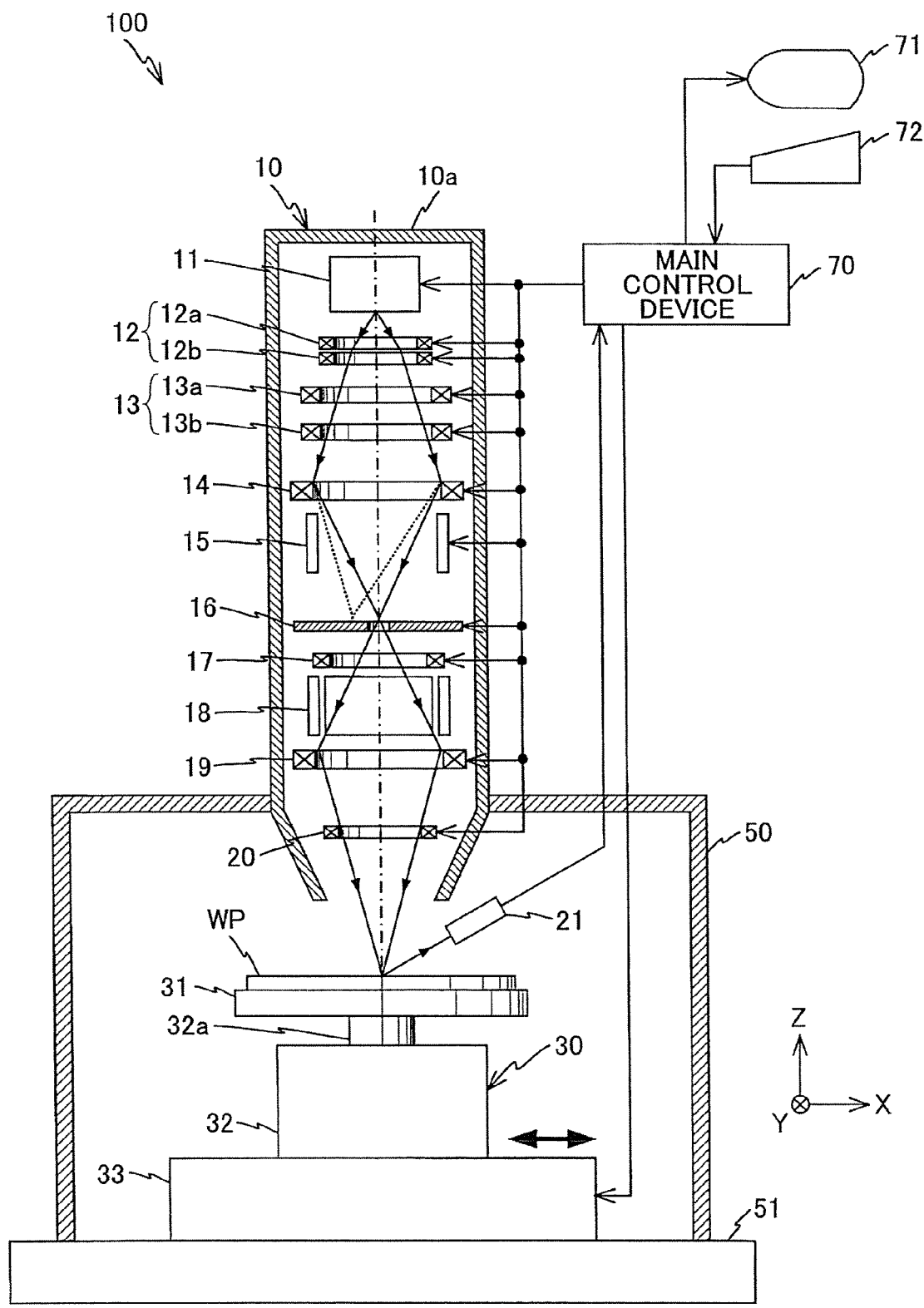
FIG. 1 is a schematic diagram showing a drawing apparatus 100 according to a first embodiment of the present invention.

DESCRIPTION OF THE REFERENCE NUMERALS 10 irradiation apparatus
10a casing
11 electron source
12 electrostatic lens
12a,12b cylindrical lens
13 axis adjustment coil
13a, 13b toroidal coil
14 converging lens
15 blanking electrode
16 aperture plate
17 astigmatism correction coil
18 scanning electrode
19 objective lens
20 dynamic focus correction lens
21 electron detector
30 rotary table unit
31 rotary table
32 spindle motor
32a axle
33 slide unit
50 vacuum chamber
51 base plate
70 main control device
71 monitor
72 input device
100 drawing apparatus
201 center
202 region of concentric circle
203 region between adjoining concentric circles
210 substrate
401 substrate
402 magnetic layer
403 resin layer
410 intermediate body
501 substrate
502 resist layer
503 master
504 stamper
505 resin
506 $CF_4$ ion
507 magnetic thin film
508 master information carrier
509 magnetic recording medium
WP: reference sample

BEST MODE FOR CARRYING OUT THE INVENTION

First Embodiment

In the following, a first embodiment of the present invention is described with reference to FIGS. 1 through 9. FIG. 1 is a schematic drawing illustrating a drawing apparatus 100 according to the first embodiment of the present invention. The drawing apparatus 100 is a drawing apparatus capable of drawing a fine pattern on a drawing surface of a sample by irradiating an electron beam onto the sample on which the drawing surface is formed by coating a resist material, for example, under a condition of $10^{-4}$ Pa in degree of vacuum.

As shown in FIG. 1, the drawing apparatus 100 includes a rotary table unit 30 on which a sample is mounted, an irradiation apparatus 10 for irradiating an electron beam onto the sample, a vacuum chamber 50 for housing the rotary table unit 30, and a main control unit 70 for integrally controlling those elements of the drawing apparatus 100.

The vacuum chamber 50 is a hollow member having a rectangular shape with the bottom (−Z direction) opened and tightly in contact with an upper surface of a base plate 51. Further, an opening is formed in an upper surface of the vacuum chamber 50 so that a lower portion of the irradiation apparatus 10 can be inserted through the opening.

The rotary table unit 30 is displaced on the base plate 51 and in the vacuum chamber 50. The rotary table unit 30 includes a rotary table 31 on which a sample is mounted, an axle 32a, a spindle motor 32 for horizontally supporting the rotary table 31 and rotating the axle 32a at a prescribed rotating speed, and a slide unit 33 for supporting the spindle motor 32 and moving the spindle motor 32 in x-axis direction at a prescribed stoke.

The irradiation apparatus 10 includes a casing 10a with its longitudinal direction orientated in z-axis direction and other elements arranged in an order from the top to the bottom inside the casing; an electron source 11, an electrostatic lens 12, an axis adjustment coil 13, a converging lens 14, a blanking electrode 15, an aperture plate 16, an astigmatism correction coil 17, a scanning electrode 18, an objective lens 19, a dynamic focus correction lens 20, and an electron detector 21. In the following, for descriptions purposes, the electrostatic lens 12, the axis adjustment coil 13, the converging lens 14, the astigmatism correction coil 17, the objective lens 19, and the dynamic focus correction lens 20 are collectively called an irradiation system.

The casing 10a is a cylindrical casing with the bottom opened and inserted downward so as to tightly fit the opening formed in the upper surface of the vacuum chamber 50. Further, the casing 10a has a taper shape in the end portion in −z direction where the diameter of the casing 10a becomes smaller in proportion to nearing the bottom end of the casing 10a.

The electron source 11 is disposed in the upper portion in the casing 10a. The electron source 11 is a thermal-field-emission-type electron source irradiating an electron beam having a diameter of about 20 nm to about 50 nm downward (in −z direction).

The electrostatic lens 12 includes a pair of cylindrical lenses 12a and 12b adjoining each other in a vertical direction below the electron source 11. Different amounts of current are supplied to the cylindrical lenses 12a and 12b, and forces are applied to the electron beams irradiated from the electron source 11 when the electron beams pass through the cylindrical lenses 12a and 12b so that the electron beams converge.

The converging lens 14 is disposed below the electrostatic lens 12 with the axis adjustment coil 13 disposed therebetween. The converging lens 14 converges the electron beams passed through the electrostatic lens 12.

The axis adjustment coil 13 is disposed between the electrostatic lens 12 and the converging lens 14. The axis adjustment coil 13 includes a pair of toroidal coils 13a and 13b adjoining each other in a vertical direction for correcting a lateral offset error of the electron beams passing between the electrostatic lens 12 and the converging lens 14.

The blanking electrode 15 is disposed below the converging lens 14. The blanking electrode 15 includes a pair of electrodes facing each other disposed on +X and −X sides of the optical axis of the converging lens 14 so as to deflect the electron beams passed through the converging lens 14 to +X or −X direction in accordance with the voltage applied from the main control device 70.

The aperture plate 16 is a plate member in which an aperture is formed at the center thereof and is disposed so that the center of the aperture is positioned on the optical axis of the converging lens 14 and below the blanking electrode 15.

The astigmatism correction coil 17 is a toroidal coil disposed below the aperture plate 16 and corrects the astigmatism of the electron beams passed through the aperture of the aperture plate 16.

The scanning electrode 18 is disposed below the astigmatism correction coil 17. The scanning electrode 18 includes a pair of electrodes facing each other disposed on +X and −X sides of the optical axis of the converging lens 14 and a pair of electrodes facing each other disposed on +Y and −Y sides of the optical axis of the conversing lens 14 and deflects the electron beams passed through the aperture of the aperture plate 16 in X and Y directions in accordance with the voltage applied from the main control unit 70.

The objective lens 19 is disposed below the scanning electrode 18 and converges the electron beam passed through the scanning electrode 18 onto a surface of a sample mounted on the rotary table 31. The spot diameter of an electron beam (beam diameter) converged onto a surface of a sample can be set in a range, for example, between about 10 nm and about 200 nm.

The dynamic focus correction lens 20 performs a fine adjustment of the beam spot diameter of the electron beam converged onto the surface of the sample by the objective lens 19.

The electron detector 21 is disposed in the vicinity of the rotary table 31 and detects when electron beams are irradiated onto a sample mounted on the rotary table, secondary electrons generated from the sample, reflected electrons reflected off from the sample, or transmitted electrons transmitted by the sample and supplies a signal in response to the amount of detected electrons (hereinafter referred to as an electron signal) to the main control device 70. In the following description, it is assumed that the secondary electron signal generated by a sample is used.

In the drawing apparatus 100 described above, an electron beam irradiated from the electron source 11 is converged by passing through the electrostatic lens 12 and the converging lens 14 and first converges in the vicinity of the aperture of the aperture plate 16 (hereinafter referred to as a crossover point). Next, the electron beam passed through the crossover point is diffused and the beam diameter of the electron beam is formed by passing through the aperture of the aperture plate 16. Next, the astigmatism of the electron beam is corrected by the astigmatism correction coil 17 and then the electron beam is converged onto a surface of a sample on the rotary table 31. Then, in this status, the voltage to be applied to the scanning electrode 18 is controlled so as to deflect the electron beam in X and Y directions, thereby enabling the scanning of the electron beam on the surface of the sample.

In parallel to the above operations, a voltage applied to the blanking electrode 15 is controlled so as to, for example, deflect the electron beam to −x direction as shown in the dashed lines of FIG. 1, thereby cutting off the electron beam at the aperture plate 16 to turn ON/OFF the blanking of the electron beam onto the sample.

The main control device 70 is a control computer including, for example, a CPU and a memory in which a program and parameters for controlling the above elements are stored. The main control device 70 controls the irradiation apparatus 10 and the rotary table unit 30 based on an instruction input to the input device 72 and causes a monitor 71 to display the information of the irradiation apparatus 10 and rotary table unit 30 and an image formed based on the secondary electron signal from the electron detector 21.

Figure 2A:
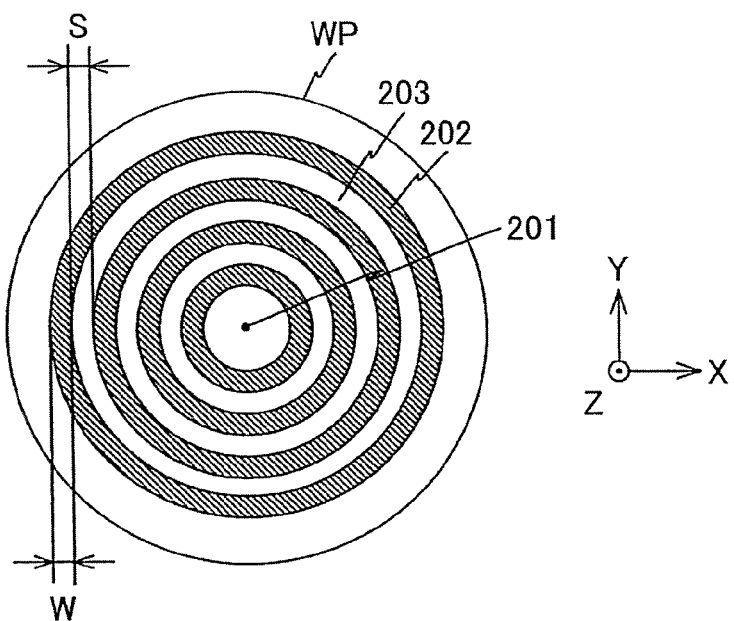
FIGS. 2A through 2C are drawings (No. 1 through 3) of reference samples "WP"

Next, an aberration evaluation method of evaluating the aberration in the irradiation apparatus 10 configured as above is described. In this aberration evaluation method, for example, a sample on which an evaluation pattern of plural concentric circles in the center thereof is formed as shown in FIG. 2A (hereinafter referred to as a reference sample) "WP" is mounted on the rotary table 31. Then, the focus of the irradiation apparatus 10 is adjusted on the surface of the reference sample "WP" and an image (SEM image) based on the secondary electron signal obtained by scanning the reference sample "WP" is monitored.

The configuration of the reference sample "WP" is described. In the example of FIG. 2A, plural concentric circles 200 (four circles due to space limitation) shown in cross-hatching and having the same center 201 are formed on the surface of the reference sample "WP". Each concentric circle has a prescribed width "W" and adjoining concentric circles are separated from each other by the distance "S". As described below, since an image based on the secondary electron signal is obtained by scanning an electron beam onto the surface of the reference sample WP, it is necessary to determine the values of the width "W" and the distance "S" in accordance with the spot diameter of the electron beam. Generally speaking, it is good when each value of the width "W" and the distance "S" is larger than the spot diameter of the electron beam, and each of the width "W" and the distance "S" is commonly set several times to dozens of times the spot diameter of the electron beam. The values of the width "W" and the distance "S" may be the same and may be different from each other. In the example of FIG. 2A, each value of the width "W" and the distance "S" is the same over the entire surface of the reference sample "WP".

Figure 2B:
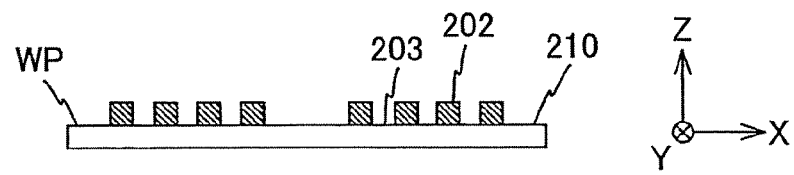

In such a concentric circle pattern, as shown in FIG. 2B as an example, a concave/convex pattern can be formed on the surface of the substrate 210 by setting the regions of concentric circles 202 to be concave sections and setting the regions between adjoining concentric circles 203 to be convex sections or by setting the regions of concentric circles 202 to be convex sections and setting the regions between adjoining concentric circles 203 to be concave sections. FIGS. 2A and 2B show where the regions adjoining concentric circles 203 and a region inside the smallest concentric circle are set as concave sections. On the contrary, the regions of concentric circles 202 may be set as concave sections and the regions between adjoining concentric circles 203 may be set as convex sections.

Figure 4A:
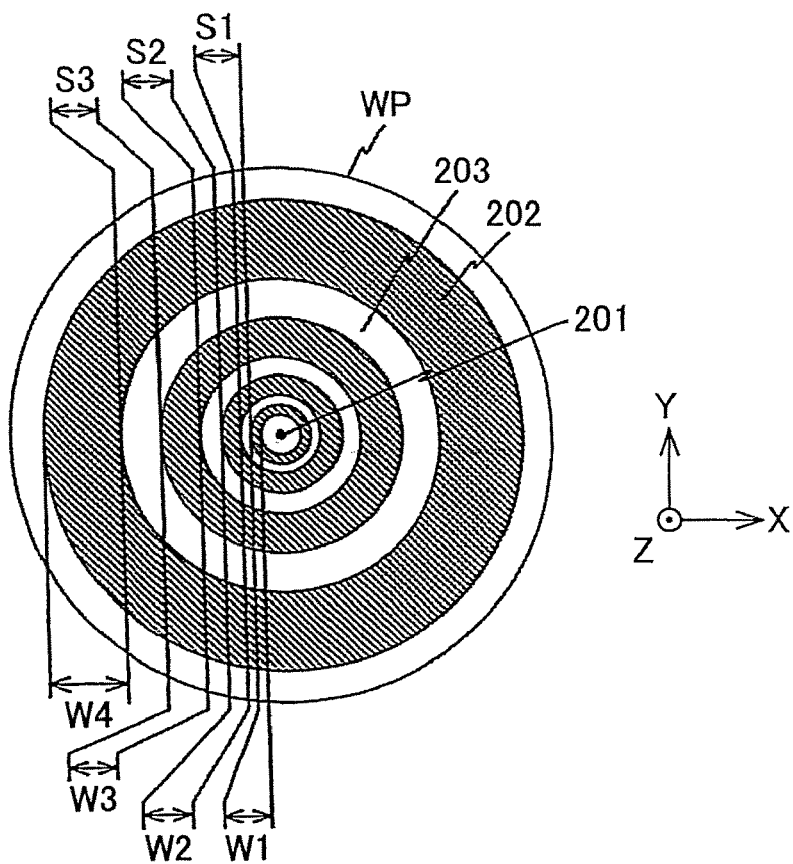
FIGS. 4A and 4B are drawings (No. 6 and 7) of reference samples "WP"
Figure 4B:

The concave-convex pattern of the above reference sample "WP" can be formed using, for example, lithography technology. FIG. 4B shows an actual example of a reference sample "WP" having a concentric circle pattern where the width of the convex section is 70 nm, the width of the concave section is 30 nm, and the height of the convex section is 200 nm. These values are experimentally obtained so that the image forming performance become best when the spot diameter of the electron beam is 20 nm. The diameter of the center concave section is 200 nm. The concave-convex pattern is formed by applying resist on a silicon wafer substrate, drawing the concentric circle pattern on the substrate using an electron drawing apparatus, and developing the pattern. The concentric circle pattern is a simple combination of concentric circles therefore no instruction to form a complex pattern is necessary to be input to the electron beam apparatus and the drawing can be done though simple operations.

Figure 2C:
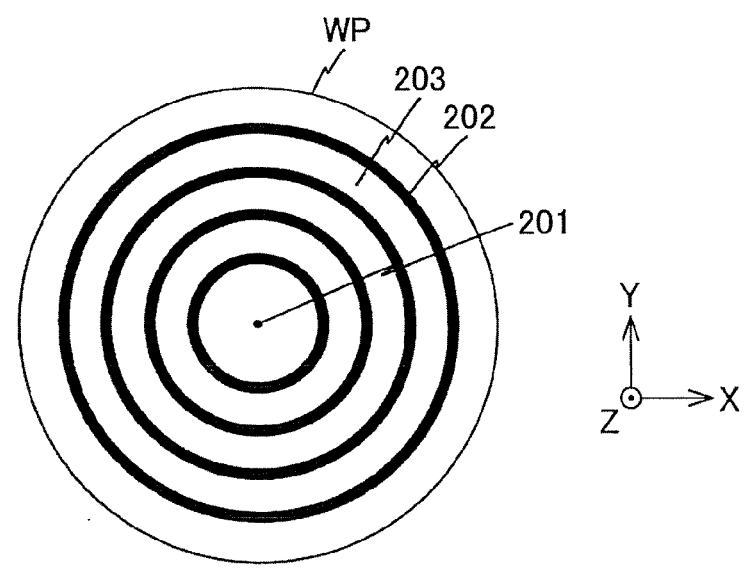

The position of the reference sample "WP" on the rotary table unit is adjusted so that the electron beam is irradiated onto the center 201 of the concentric circle pattern under a non-deflecting condition where the operation of the scanning electrode 18 is stopped. In the following descriptions, it is assumed that the electron beam is set to irradiate onto the center of the concentric pattern of the reference sample "WP" under the non-deflecting condition. Further, it should be noted that each circle in FIGS. 6 through 9 having the width "W" as described with reference to FIG. 2 is abbreviated to be a simple circle as shown in FIG. 2C.

Figure 6:
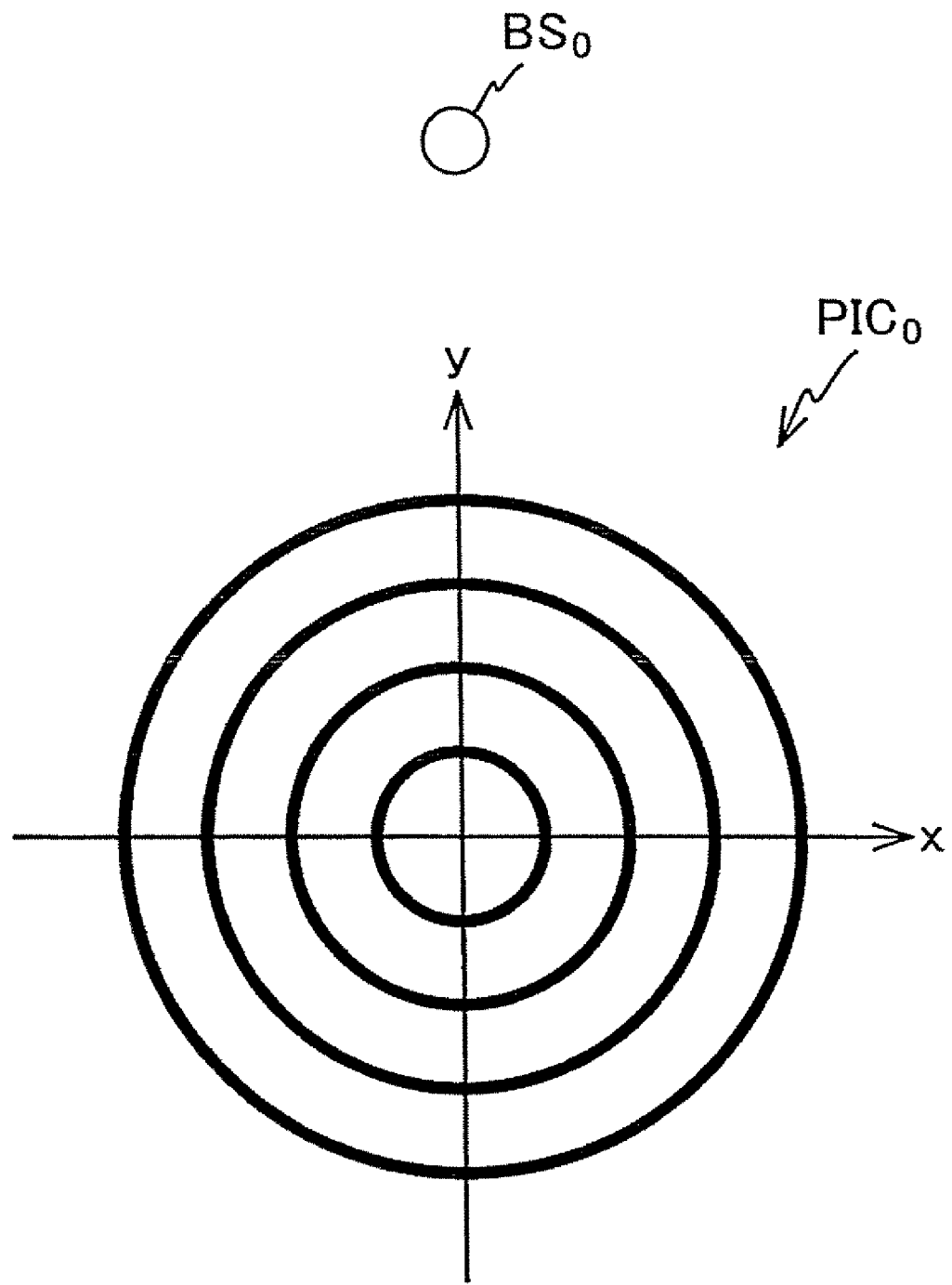
FIG. 6 is a drawing (No. 1) illustrating an evaluation method of astigmatism.

FIG. 6 shows a spot "$BS_0$" of a perfect-circle-shaped electron beam without astigmatism (reference electron beam) and an image "$PIC_0$" formed based on the secondary electron signal obtained when the reference electron beam is scanned onto the reference sample "WP". When the reference electron beam is scanned onto the reference sample "WP", a sharp image without blur over the entire circumference of each circle "$PIC_0$" (a reference image) like an image "$PIC_0$" shown in FIG. 6 is observed.

Figure 7:
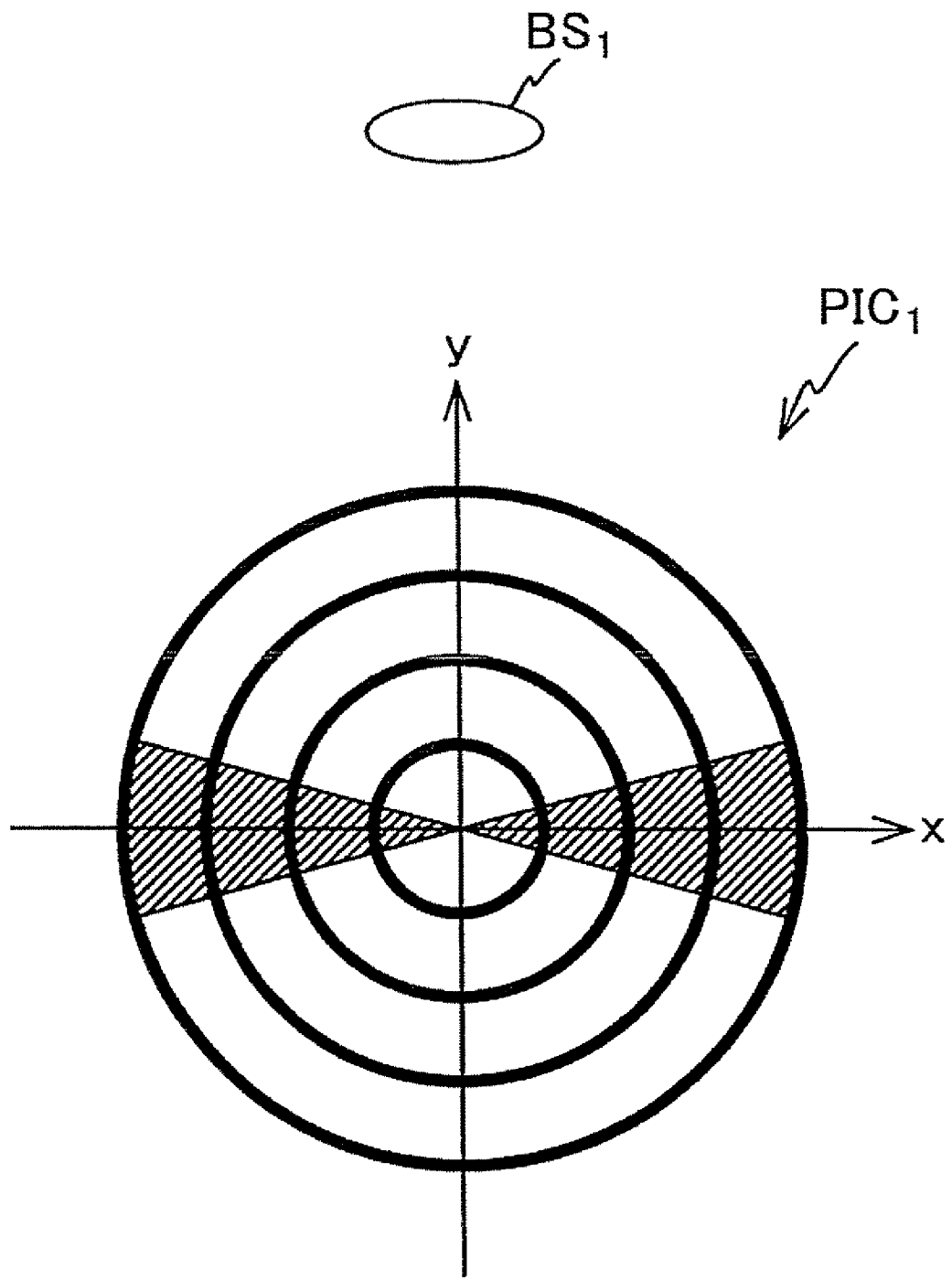
FIG. 7 is a drawing (No. 2) illustrating an evaluation method of astigmatism.

FIG. 7 shows an elliptically-shaped spot "$BS_1$" of an electron beam with its major axis parallel to the x-axis due to, for example, astigmatism in the x-axis direction of the irradiation system in the irradiation apparatus 10, and an image "$PIC_1$" formed based on a secondary electron signal obtained by scanning the electron beam onto the reference sample "WP" (hereinafter referred to as a scanned image). When an electron beam is influenced by astigmatism in the x-axis direction, an image having blur mainly in the cross-hatching region including the x-axis is observed as shown in the drawing of "$PIC_1$" in FIG. 7.

Figure 8:
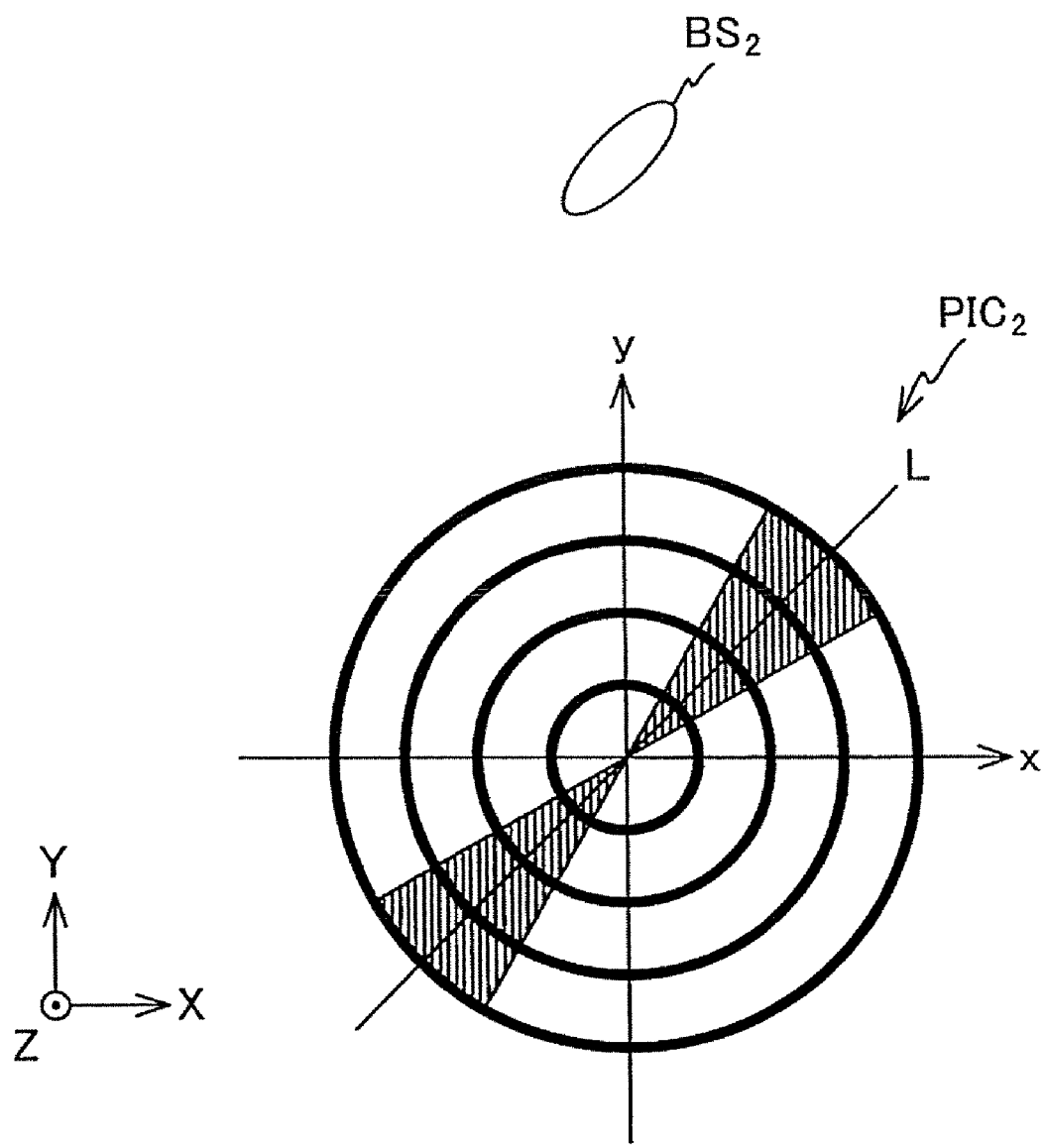
FIG. 8 is a drawing (No. 3) illustrating an evaluation method of astigmatism.

Further, FIG. 8 shows an elliptically-shaped spot "$BS_2$" of an electron beam with its major axis parallel to a straight line L having an angle of 45 degrees with respect to the x-axis and the y-axis due to, for example, astigmatism in the x-axis and y-axis directions of the irradiation system in the irradiation apparatus 10, and a scanned image "$PIC_2$" obtained by scanning the electron beam onto the reference sample "WP". When and electron beam is influenced by astigmatism in the straight line L having an angle of 45 degrees with respect to the x-axis and the y-axis directions, an image having blur mainly in the cross-hatching region including the straight line L having an angle of 45 degrees with respect to the x-axis and the y-axis is observed as shown in the drawing of "$PIC_2$" in FIG. 8.

Namely, an image displayed on the monitor 71 when the reference sample "WP" is scanned shows the existence of astigmatism. For example, the blur in the region including the x-axis as shown in FIG. 7 shows the existence of astigmatism in the x-axis direction of the irradiation system in the irradiation apparatus 10, and the blur mainly in the region including the straight line L as shown in FIG. 8 shows the existence of the astigmatism along the straight line L direction.

Figure 9:
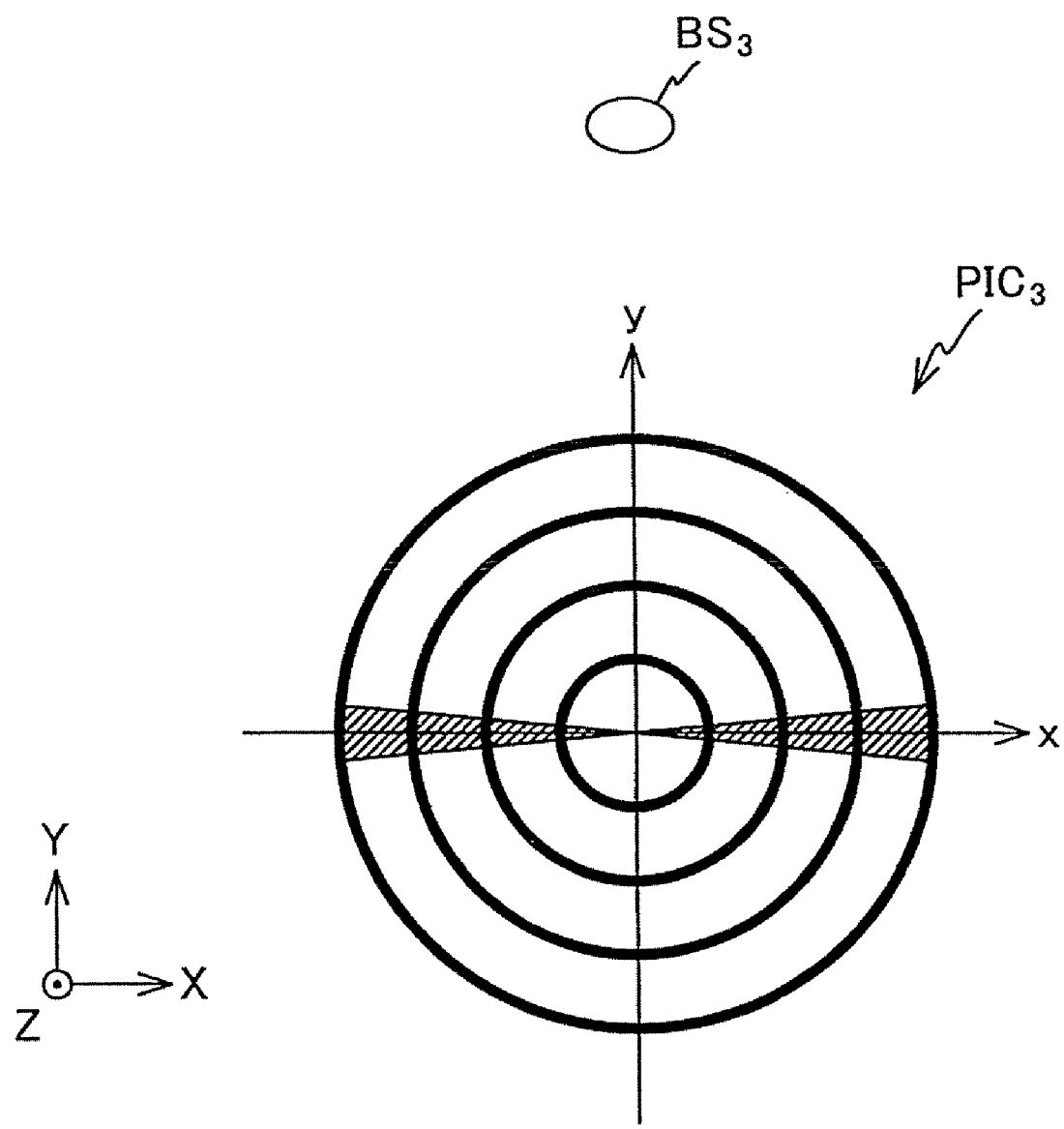
FIG. 9 is a drawing (No. 4) illustrating an evaluation method of astigmatism.

Further, FIG. 9 shows a beam spot "BS$_3$" of an electron beam when the astigmatism is smaller than that in a case of the beam spot "BS$_1$" shown in FIG. 7, and a scanned image "PIC$_3$" obtained by scanning the electron beam onto the reference sample "WP". As is obvious from the comparison of the images "PIC$_1$" and "PIC$_3$" shown in FIGS. 7 and 9, respectively, as astigmatism is reduced, the cross-hatching region where an image has blur becomes narrower. Therefore, it is possible to evaluate the magnitude of astigmatism in accordance with the size of the region where an image has blur obtained by scanning the reference sample "WP".

As described above, when there is a region where an image has blur upon scanning the reference sample "WP", the astigmatism of the irradiation system can be corrected by controlling the astigmatism correction coil by, for example, inputting a correction instruction for astigmatism correction in the input device 72. Specifically, while comparison is made between a scanned image obtained after the input of the correction instruction and the reference image "PIC$_0$" shown in FIG. 6, the astigmatism correction operation is performed so that the scanned image approaches appearing like the reference image. In this process, as the astigmatism correction proceeds, the part of an image having blur obtained by scanning the reference sample "WP" becomes smaller. Therefore, in a typical operation, while the astigmatism correction proceeds, the magnification is appropriately increased so as to monitor a smaller region of an image, thereby enabling the observation of a magnified blurred region.

After astigmatism of the irradiation apparatus 10 is evaluated and the astigmatism correction operation for the irradiation apparatus 10 is completed as described above, the reference sample "WP" is removed by, for example, a conveying device (not shown) and a sample is mounted on the rotary table 31. Then, a concentric circle pattern or a spiral pattern can be formed on the sample without being affected by the astigmatism by driving the irradiation apparatus 10 and the rotary table unit 30.

As described above, according to the first embodiment of the present invention, a pattern comprising four concentric circles is formed on the surface of the reference sample "WP". Therefore, it is possible to detect the direction and the magnitude of the astigmatism of the irradiation system in the irradiation apparatus 10.

Further, since the astigmatism detected as described above can be corrected by controlling the astigmatism correction coil 17, it is possible to draw a pattern unaffected by the astigmatism on a sample.

In the above description of the first embodiment of the present invention, after the direction and the magnitude of astigmatism are detected by comparing the reference image and the scanned image, the astigmatism correction is performed by inputting the correction instruction in the input device 72. However, the embodiment is not limited to this arrangement. The astigmatism correction may be performed by, for example, storing information of the reference image in the main control device 70, performing a match between the reference image and the scanned image, detecting the direction and the magnitude of the astigmatism automatically, and controlling the astigmatism correction coil 17 based on the detection result.

Second Embodiment

Next, a second embodiment of the present invention is described with reference to FIGS. 10 through 15. It should be noted that the same reference numerals are used for the same or equivalent elements as those in the first embodiment, and the descriptions of the elements are omitted or abbreviated.

Figure 10:
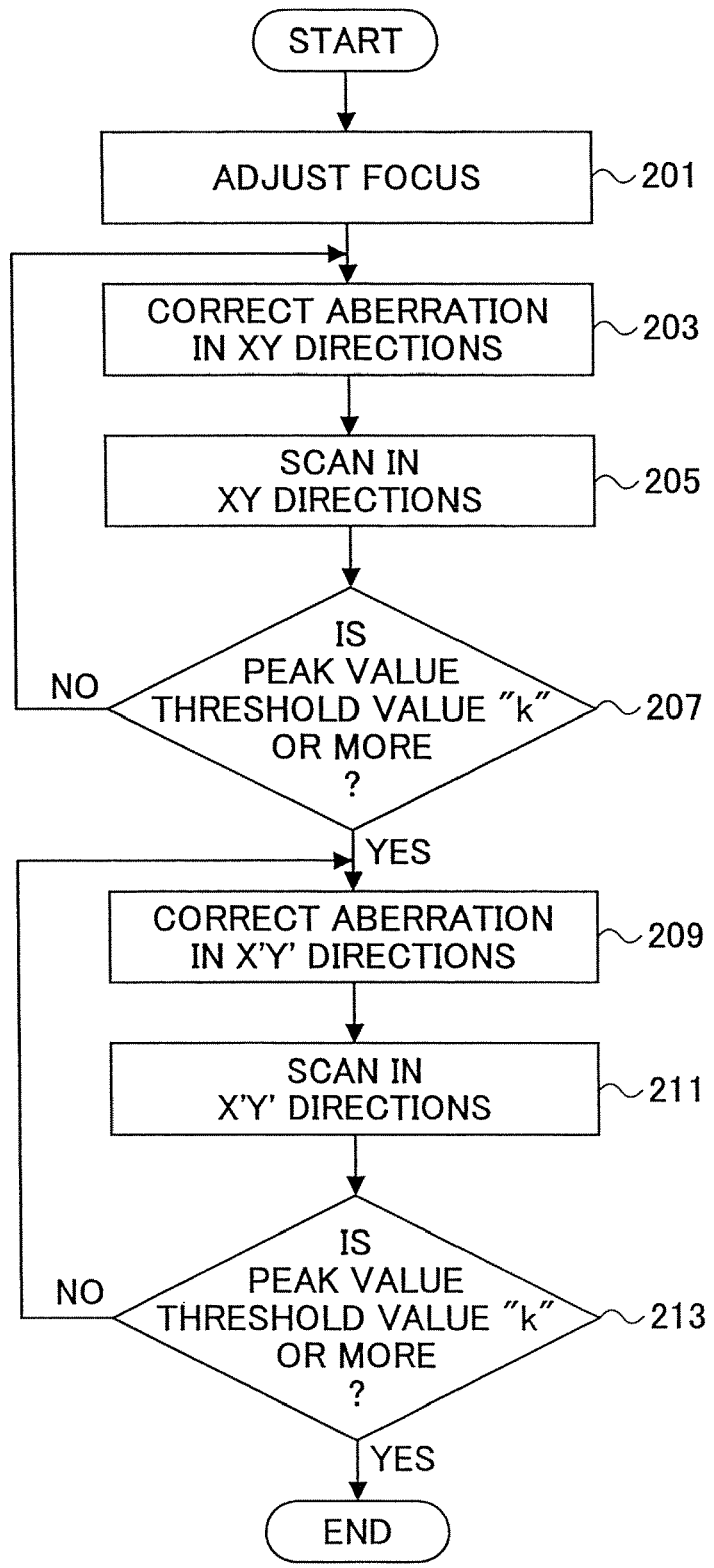
FIG. 10 is a flowchart showing a process of an astigmatism correction according to a second embodiment of the present invention.

FIG. 10 is a flowchart showing a series of processes carried out by the main control device 70 in the irradiation apparatus 10 when an astigmatism correction method according to the second embodiment of the present invention is performed. In the following, a method of correcting the astigmatism of the irradiation system in the irradiation apparatus 10 based on the descriptions in FIG. 10 is described. The assumption is that the reference sample "WP" shown in FIG. 11 is mounted on the rotary table 31 of the drawing apparatus 100, an x,y coordinate system with its origin at the center of the reference sample "WP" and an x',y' coordinate system rotated 45 degrees with respect to the x,y coordinate system are defined, and the efficiency of generation of secondary electrons with respect to the electron beam is high at four circle portions of the reference sample "WP".

When the main control device 70 confirms the input of the astigmatism correction instruction to the input device 72, the main control device 70 starts the astigmatism correction processes. In the first step 201, the focus of the irradiation apparatus 10 with respect to the reference sample "WP" is adjusted. As an example, FIG. 12A shows a beam spot of the electron beam having astigmatism in the x-axis and the Y-axis directions, and FIG. 12B shows a beam spot of the electron beam having astigmatism in the x'-axis and the y'-axis directions. Generally, when the ratio of the astigmatism in the x-axis and the Y-axis directions is similar to the ratio of the astigmatism in the x'-axis and the y'-axis directions, the spot of the electron beam becomes a substantially perfect circle at the focus position. Further, as the degree of underfocus is increased, the spot shape of the electron beam becomes an elliptical shape with its major direction parallel to, for example, the y-axis or the y'-axis direction, and as the degree of overfocus is increased, the spot shape of the electron beam becomes an elliptical shape with its major direction parallel to, for example, the x-axis or the x'-axis direction. It should be noted that the change of the spot shape is not limited to the manner described above. For example, as the degree of underfocus is increased, the spot shape of the electron beam may become an elliptical shape with its major direction parallel to the x-axis or the x'-axis direction, and as the degree of overfocus is increased, the spot shape of the electron beam may become an elliptical shape with its major direction parallel to the y-axis or the y'-axis direction. Herein, descriptions are made assuming that the spot shape changes in the former manner.

Figure 11:
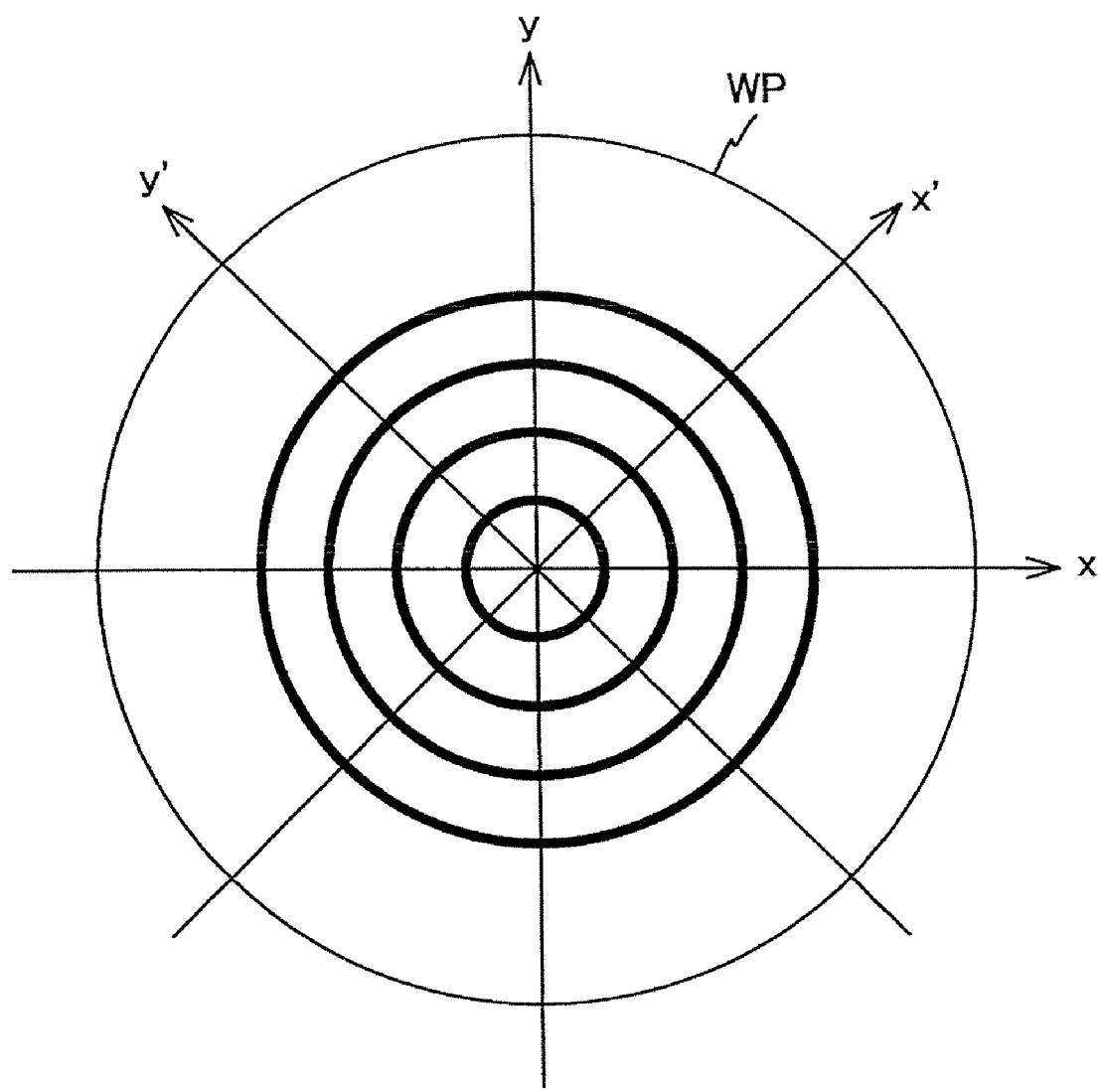
FIG. 11 is a drawing showing x,y coordinates of a reference sample "WP"

When the irradiation system is underfocused and the reference sample "WP" is scanned along the x-axis and the y-axis or the x'-axis and the y'-axis shown in FIG. 11, secondary electron signals $S1x$, $S1y$, $S1x'$, and $S1y'$ having the intensity distribution as shown in FIG. 13A detected by the secondary electron detector 21 are observed. The secondary electron signals $S1x$, and $S1x'$ are the secondary electron signals obtained when the reference sample "WP" is scanned along the x-axis and the x'-axis, respectively and the secondary electron signals $S1y$, and $S1y'$ are the secondary electron signals obtained when the reference sample "WP" is scanned along the y-axis and the y'-axis, respectively. As shown in FIG. 13A, when the irradiation system is underfocused and the spot shape is elliptical with its major direction parallel to the y-axis or the y'-axis as shown in FIG. 12A or 12B, respectively, the peak value of the secondary electron signals $S1x$ and $S1x'$ become greater.

On the other hand, when the irradiation system is overfocused and the reference sample "WP" is scanned, secondary electron signals $S2x$, $S2y$, $S2x'$, and $S2y'$ having the intensity distribution as shown in FIG. 13b are observed. The secondary electron signals S2x, and S2x' are the secondary electron signals obtained when the reference sample "WP" is scanned along the x-axis and the x'-axis, respectively and the secondary electron signals S2y, and S2y' are the secondary electron signals obtained when the reference sample "WP" is scanned along the y-axis and the y'-axis, respectively. As shown in FIG. 13B, when the irradiation system is overfocused and the spot shape is elliptical with its major direction parallel to the x-axis or the x'-axis as shown in FIG. 12A or 12B, respectively, the peak value of the secondary electron signals S2y and S2y' become greater.

Therefore, the objective lens 19 is controlled so that the peak values of the secondary electron signals obtained by scanning the reference sample "WP" along the x-axis and the y-axis or the x'-axis and the y'-axis become substantially equal to each other like the secondary electron signals S3x and S3y or S3x' and S3y', respectively, as shown in FIG. 13C. In this case, the spot shape becomes a circle of least confusion having a substantially perfect-circle shape.

In step 203, the aberration in x and y directions is corrected. After the focus is adjusted as described above, the aberration in x and y directions is corrected by driving the astigmatism correction coil 17. As a result, the x and y directions of the spot become narrower and the spot shape becomes a substantially perfect circle.

Figure 15A:
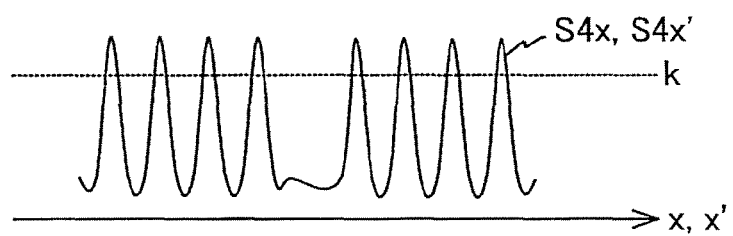
FIGS. 15A and 15B are drawings (No. 1 and 2) showing secondary electron signals after the astigmatism corrections.
Figure 15B:
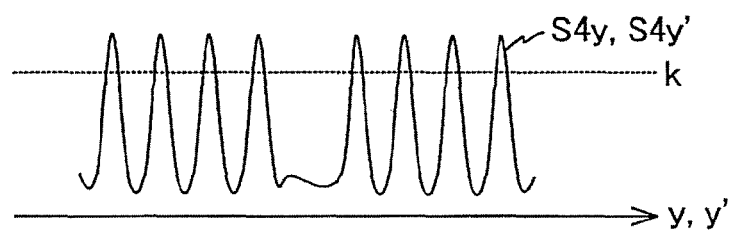

In step 205, the reference sample "WP" is scanned along the x-axis and the y-axis. As a result, the secondary electron signals S4x and S4y having the intensity distribution as shown in FIGS. 15A and 15B, respectively as an example are observed.

In step 207, it is determined whether the peak values of the secondary electron signals S4x and S4y observed in step 205 are equal to or more than a prescribed threshold value "k". Here, the threshold value "k" is set so as to be slightly lower than the peak value of the secondary electron signal observed when the aberration in x and y directions is minimally corrected. Namely, when the peak values of the secondary electron signal S4x and S4y are lower than the threshold value "k", it is determined that the correction of the aberration in x and y directions is insufficient. Then the process goes back to step 203 to repeat the processes in steps 203 through 207 until the peak value of the secondary electron signal becomes equal to or more than the threshold value "k". On the other hand, when the peak of the secondary electron signal becomes sharp and the peak value of the secondary electron signal becomes equal to or more than the threshold value "k", it is determined that the astigmatism correction in x and y directions is completed and the process goes to the next step 209.

In step 209, the aberration in x' and y' directions is corrected. In the irradiation system where the astigmatism in x and y directions are corrected as described above, the aberration in x' and y' directions is corrected by driving the astigmatism correction coil 17. As a result, the x' and y' directions of the spot become narrower and the spot shape becomes a substantially perfect circle.

In step 211, the reference sample "WP" is scanned along the x'-axis and the y'-axis. As a result, the secondary electron signals S4x' and S4y' having the intensity distribution as shown in FIGS. 15A and 15B, respectively as an example are observed.

Figure 14A:
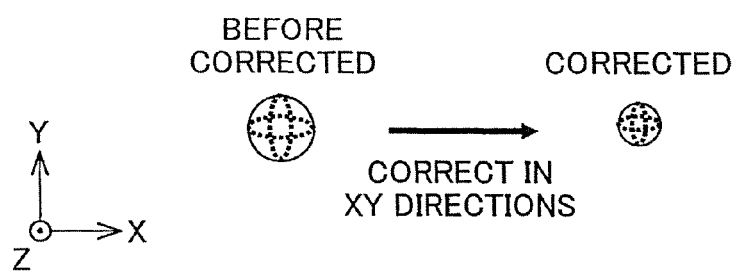
FIGS. 14A and 14B are drawings (No. 1 and 2) showing the spot shapes of an electron beam corresponding to astigmatism corrections.
Figure 14B:
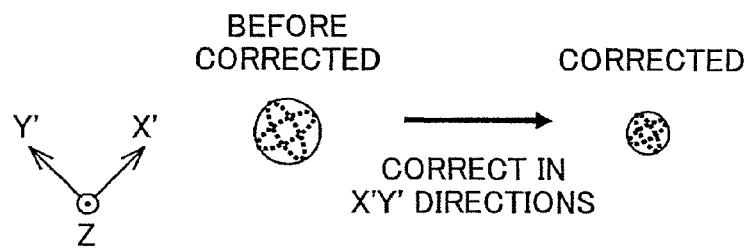

In step 213, it is determined whether the peak values of the secondary electron signals S4x' and S4y' observed in step 211 are equal to or more than a prescribed threshold value "k". Here, the threshold value "k" is set so as to be slightly lower than peak value of the secondary electron signal observed when the aberration in x' and y' directions is minimally corrected. Namely, when the peal values of the secondary electron signal S4x' and S4y' are lower than the threshold value "k", it is determined that the correction of the aberration in x' and y' directions is insufficient. Then the process goes back to step 209 to repeat the process of steps 209 through 213 until the peak value of the secondary electron signal becomes equal to or more than the threshold value "k". On the other hand, when the peak of the secondary electron signal becomes sharp and the peak value of the secondary electron signal becomes equal to or more than the threshold value "k", it is determined that the astigmatism correction in x' and y' directions is completed and the process is stopped. In this status, as shown in FIG. 14B, the spot shape is a substantially perfect circle smaller than the circles of least confusion shown in FIGS. 12A and 12B.

Even when the determination is affirmative in step 213 (when the peak value is equal to or greater than the threshold value "k"), the size of the circle of least confusion can be gradually reduced by repeating the processes of steps 201 through 213 more than once, thereby enabling more accurate astigmatism correction in x and y as well as x' and y' directions.

As described above, according to the second embodiment of the present invention, a pattern comprising four concentric circles is formed on the surface of the reference sample "WP". Therefore, it is possible to adjust the focus position of the irradiation system in the irradiation apparatus 10 by comparing the secondary electron signals obtained by scanning the reference sample "WP" along the x-axis, and the y-axis, and the x'-axis and the y'-axis, and to correct the astigmatism in the irradiation system in the irradiation apparatus 10 by observing the waveforms of the secondary electron signals.

Further, a reference pattern comprising four concentric circles is formed on the reference sample "WP". Therefore, the scanning directions are not limited to the x-axis and the y-axis, and the x'-axis and y'-axis directions and scanning in any other directions enables performing the astigmatism correction of the irradiation system in the same manner. Still further, some mountains in the distribution of the secondary electron signal obtained by scanning the reference sample "WP" allows obtaining multiple signals and hopefully accumulate signals to improve the signal to noise (S/N) ratio.

It should be noted that, in the second embodiment of the present invention, the reference sample "WP" is scanned along the x-axis and the y-axis, and the x'-axis and the y'-axis directions. However, the scanning directions are not limited to the directions above and scanning in any direction other than those directions may be performed. Further, scanning may be performed in x-axis and the y-axis, and the x'-axis and the y'-axis directions in step 201, and, for example, scanning may be performed in the direction where the spot shape when the irradiation system is underfocused is most different from the spot shape when the irradiation system is overfocused.

Figure 16:
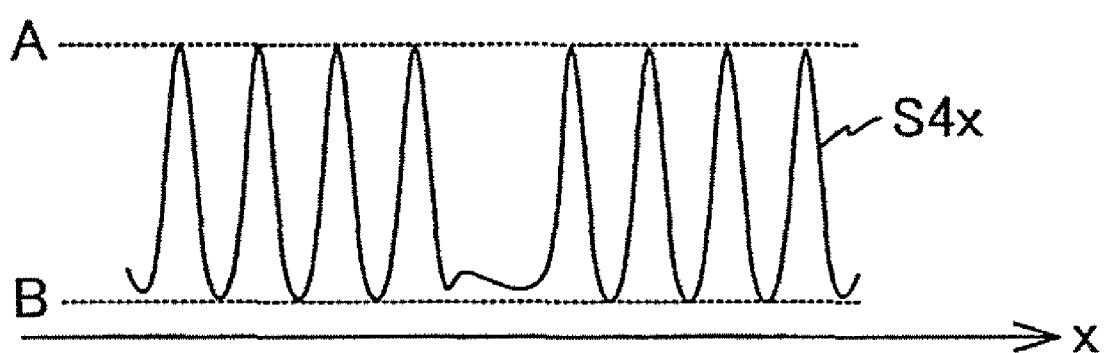
FIG. 16 is a drawing illustrating a contrast of a secondary electron signal.

Further, in this second embodiment of the present invention, when aberration in the x-axis and the y-axis, and the x'-axis and the y'-axis directions are corrected, the threshold value "k" is used as a reference to determine whether the correction is appropriate. However, this embodiment is not limited to this arrangement. For example, the contrast of the secondary electron signal may be used as a criterion. Specifically, as shown in FIG. 16, for example, the maximum (peak) value and the minimum value of the secondary electron signal are given as "A" and "B", respectively. Then, it may be determined that the aberration correction is performed when the value of (A−B)/(A+B) is equal to or greater than a prescribed value.

When image magnification is increased in the astigmatism correction process, the scanning region of the electron beam is narrower. Accordingly, it is necessary to reduce the size of an evaluation pattern on the reference sample WP. In the reference sample "WP", the nearer the center of the concentric pattern, the narrower the blur area of the image becomes. Therefore, it is desirable to shift the observation region to the vicinity of the center as the image magnification is increased. So far, descriptions are made using the reference sample "WP" having a pattern of concentric circles each have the same width "W" and the same distance "S" as shown in FIG. 2A. However, in this case, it is preferable that the width "W" and the distance "D" of the pattern become greater in the same ratio as being separated outward from the center 201 as shown in FIG. 4A (four circles only due to the space limitation). In FIG. 4A, from the center to the outer, the following expressions are given. W1<W2<W3<W4, S1<S2<S3<S4. When "c1" and "c2" are given constant values, the following expressions are given. W2=c1×W1, S2=c1×S1, W3=c2×W2, S3=c2×S2 Here, it is also appropriate even when c1=c2. As described above, an evaluation pattern may be finely formed in the vicinity of the center of the reference sample "WP" and the evaluation pattern may be formed coarsely. By this arrangement, the finely formed evaluation pattern can be used when a secondary electron signal is required to be observed with increased magnification, thereby enabling accurate astigmatism correction.

Figure 3A:
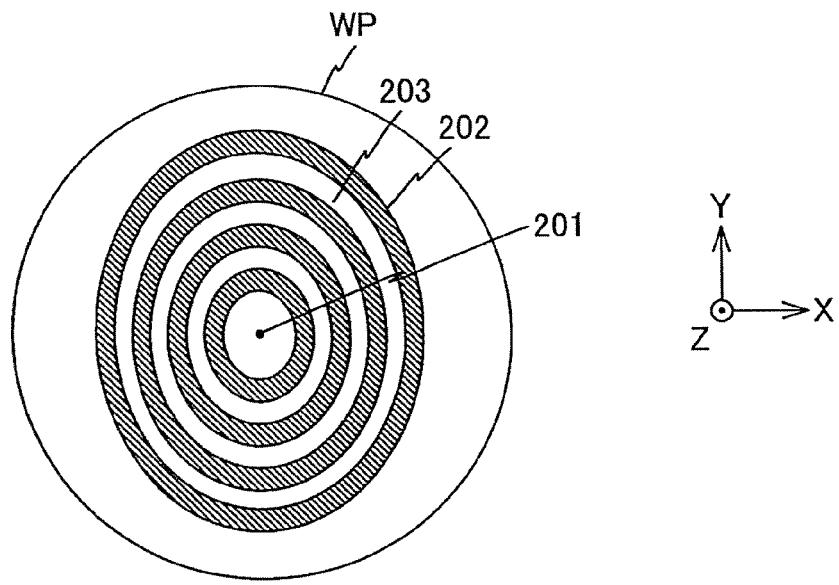
FIGS. 3A and 3B are drawings (No. 4 and 5) of reference samples "WP"
Figure 3B:
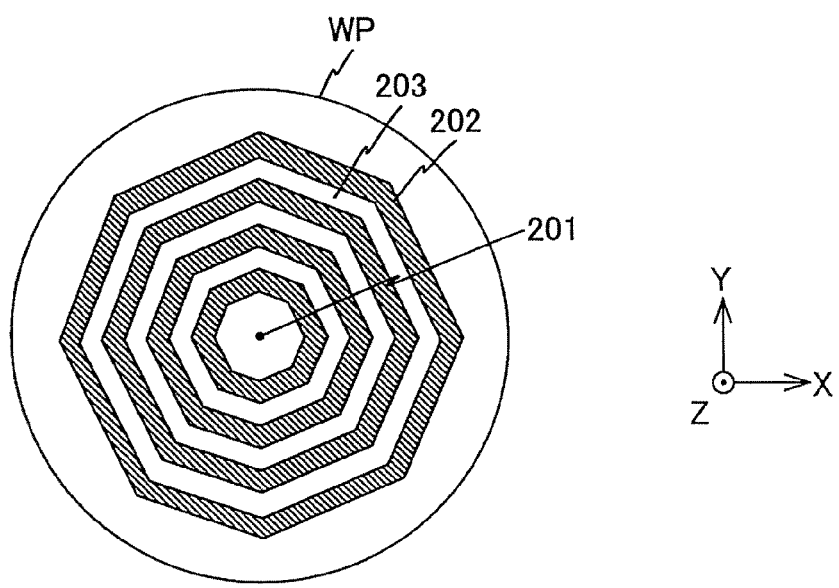
Figure 5A:
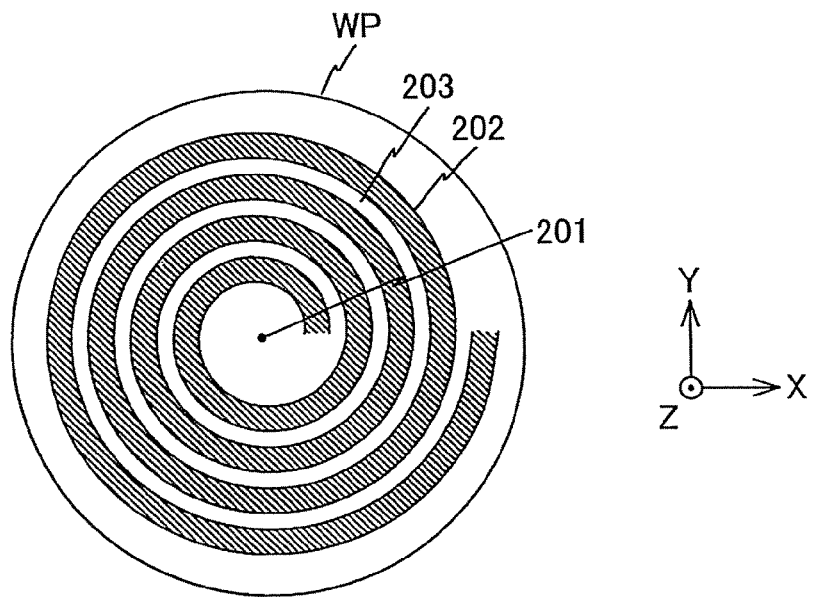
FIGS. 5A and 5B are drawings (No. 8 and 9) of reference samples "WP"
Figure 5B:
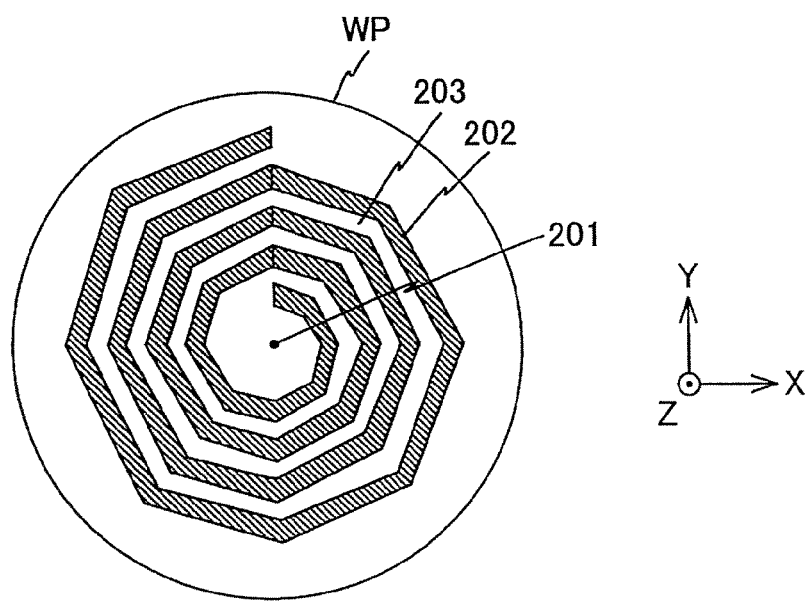

It should be noted that, in each of the embodiments described above, descriptions are made where a concentric evaluation pattern is formed on the reference sample "WP". However, a concentric elliptical pattern as shown in FIG. 3A may also be formed (four ellipses only due to space limitation). When a concentric elliptical pattern is used, the size of the blurred region differs depending on the astigmatism direction even though it is the same astigmatism (for example, when the astigmatism direction approaches the minor axis, the size of blurred area is enlarged). On the contrary, when a concentric circle pattern is used, the size of blurred region becomes constant for the entire astigmatism direction. Therefore, it is more difficult to evaluate the magnitude of the astigmatism when a concentric elliptical pattern is used compared with a concentric circle pattern. Further, a concentric regular polygon pattern with each regular polygon having a common symmetric axis (therefore the centers of the regular polygons are the same) may be formed. FIG. 3B shows concentric regular octagons (here four polygons only due to space limitation). When a concentric regular polygon pattern is used, the size of the blurred region differs depending on the crossing angle between the astigmatism direction and the direction of the side even though it is the same astigmatism. Therefore, when the number of sides is small, it is difficult to evaluate the magnitude of the astigmatism. However, when the number of side is large, this effect can be practically ignored, and the pattern can be used like a concentric circle pattern. Still further, not a concentric figure but a spiral figure as shown in FIGS. 5A and 5B may be formed.

In each embodiment as described above, four concentric figures are formed on the reference sample "WP". However, the number of the concentric figures is not limited to four.

Third Embodiment

Next, a third embodiment of the present invention is described with reference to FIGS. 17A through 18B. It should be noted that the same reference numerals are used for the same or equivalent elements as those in the first and second embodiments, and the descriptions of the elements are omitted or abbreviated.

An aberration correction method according to the third embodiment of the present invention is different from that of the above-mentioned second embodiment in the process of focus adjustment in step 201 in FIG. 10. In the following, the focus adjustment method is described.

Here, since the positional relationship between the objective lens 19 and the rotary table 31 is constant, a current value supplied from the main control device 70 to the objective lens (herein after referred to as DAC value) when the focusing position of an electron beam that receives refractive power by the objective lens 19 is focused in the vicinity of the upper surface of the rotary table 31 is defined as a reference DAC value "$I_0$".

In the drawing apparatus 100, while the DAC value supplied to the objective lens 19 is changed at a prescribed interval, for example, from the underfocus side DAC value "$I_-$" ($=I_0-\alpha$:$\alpha$>0) to the overfocus side DAC value "$I_+$" ($=I_0+\alpha$:$\alpha$>0), the electron beam focused by the refractive power based on each DAC value is scanned onto the reference sample "WP" in a specific direction (herein x-axis direction). This leads to obtaining a DAC value where the peak value of the secondary electron signal becomes a maximum value. Hereinafter, this operation is called prescan.

Figure 17A:
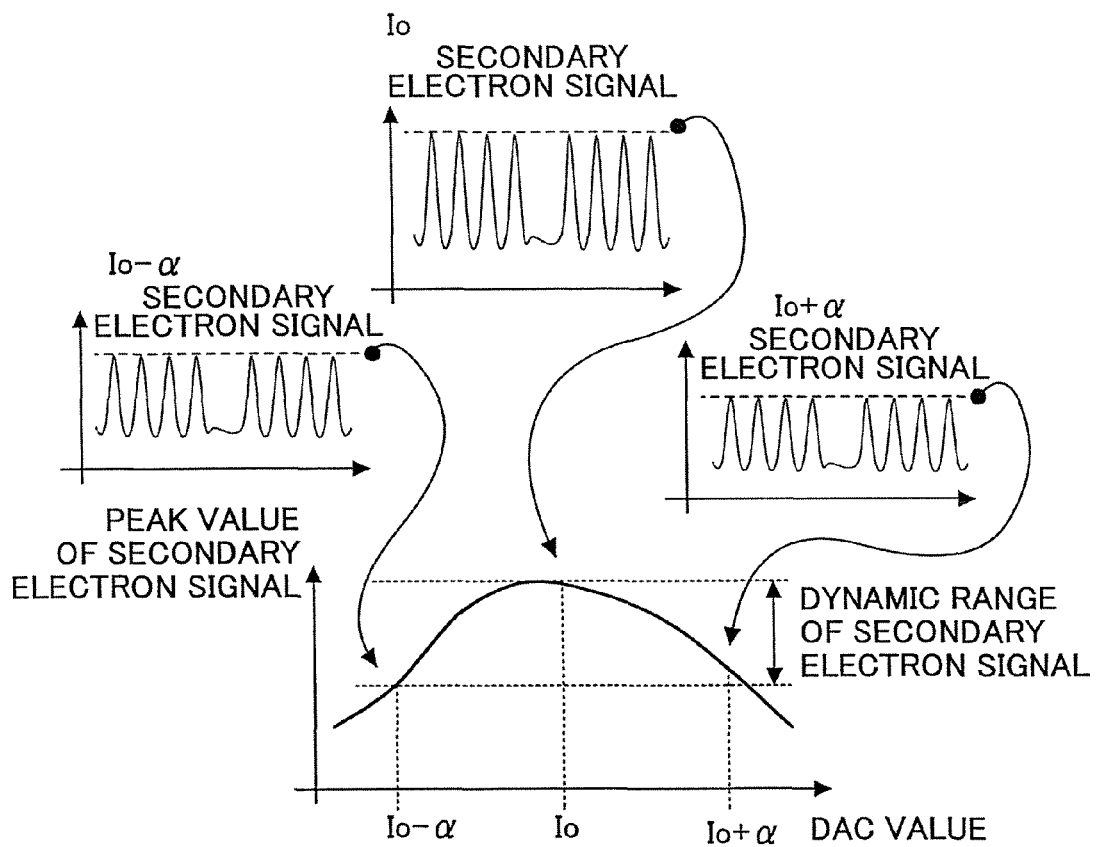
FIGS. 17A and 17B are drawings (No. 1 and No. 2) illustrating the dynamic range of an secondary electron signal in the scanning direction.
Figure 17B:
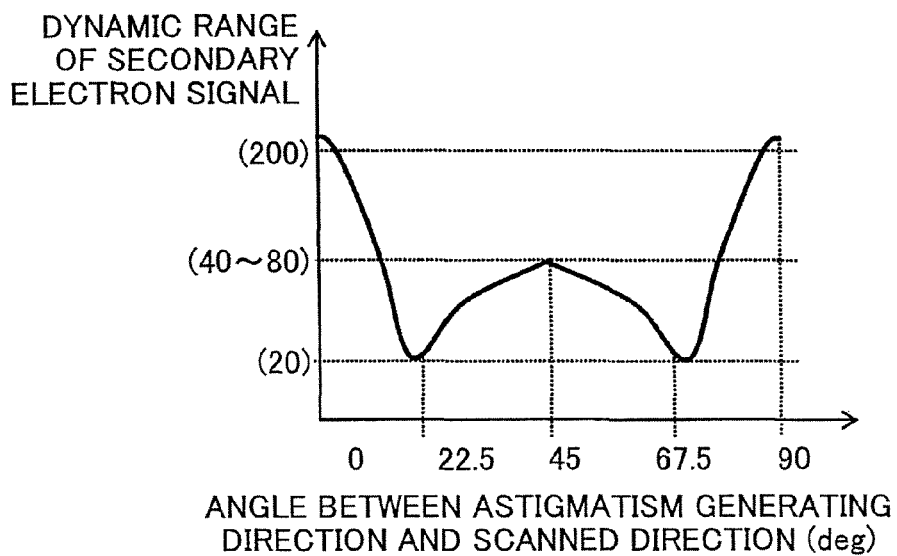

FIG. 17A is a relational drawing showing a relationship between the DAC value and the secondary electron signal obtained by the prescan of the reference sample "WP" as described above. (The maximum value–the minimum value) of the peak value of the secondary electron signal when the DAC value is changed from the underfocus side DAC value "$I_-$" ($=I_0-\alpha$) to the overfocus side DAC value "$I_+$" ($=I_0+\alpha$) is called the dynamic range of the secondary electron signal. FIG. 17B is a drawing showing a relationship between the dynamic range of the secondary electron signal obtained by the prescan of the reference sample "WP" as described above and the scanning direction with respect to the generating direction of the aberration. As shown in FIG. 17B, the dynamic range of the secondary electron beam is maximized when the scanning direction is equal to and at 90 degrees to the generating direction of the aberration, and is moderate when the scanning direction is at 45 degrees to the generating direction of the aberration. When the scanning direction is at 22.5 and 67.5 degrees to the generating direction of the aberration, the dynamic range of the secondary electron signal is minimized. For example, in the reference sample "WP" shown in FIG. 4B, the dynamic range of the secondary electron signal becomes about 200 when the scanning direction is equal to and at 90 degrees to the generating direction of aberration, becomes about 40 to about 80 when the scanning direction is at 45 degrees at the generating direction of the aberration, and becomes about 20 when the scanning direction is at 22.5 and 67.5 degrees to the generating direction of the aberration.

Therefore, in this embodiment, in step 201 of FIG. 10, the above described prescan is performed, then after the peak value of the secondary electron signal is obtained, the dynamic range of the secondary electron signal is calculated. Then, from the magnitude of the dynamic range of the secondary electron signal, the generating direction of the aberration is estimated. For example, as shown in FIG. 17B, when the dynamic range of the secondary electron signal is about 200, it is estimated the scanning direction is at 0 or 90 degrees to the generating direction of the aberration, when it is about 40 to about 80, it is estimated at 45 degrees to the generating direction, and when it is other than above, it is estimated at 22.5 or 67.5 degrees to the generating direction.

Figure 18A:
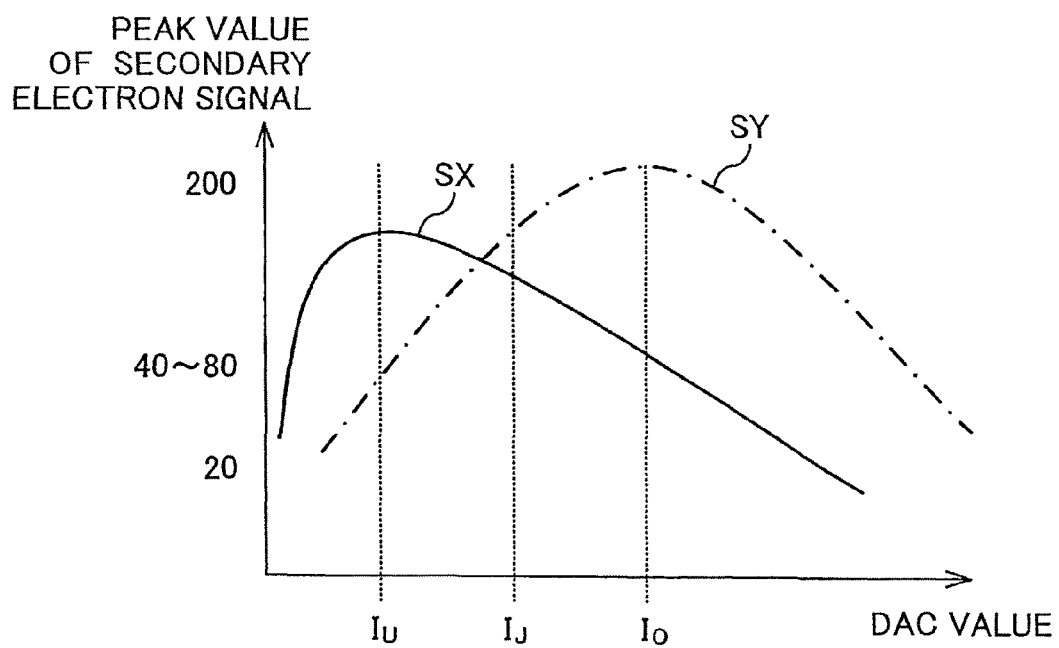
FIGS. 18A and 18B are drawings (No. 1 and 2) illustrating a determination method of a focus position.

Next, in the drawing apparatus 100, when it is estimated that the scanning direction is at 0 or 90 degrees to the generating direction of the aberration, further prescan in the y-axis direction orthogonal to the x-axis direction is performed. FIG. 18A shows curves SX and SY indicating the peak value of the secondary electron signal with respect to the DAC values obtained from the prescan results in the x-axis and y-axis directions, respectively. As shown in the curves SX and SY, the peak value of the secondary electron signal is maximized when the DAC value is $I_u$ and $I_o$, respectively. This shows that, when the DAC value is $I_j$, an averaged value of $I_u$ and a circle of least confusion of the electron beam is formed on the surface of the reference sample "WP". Therefore, herein, the position where the electron beam is converged by the objective lens 19 to which a current of DAC value $I_j$ is supplied is defined as the focus position. It should be noted that, in this status, as shown in FIGS. 12A and 12B, the spot shape of the electron beam formed on the surface of the reference sample WP is a circle of least confusion having a substantially perfect-circle shape.

Figure 18B:
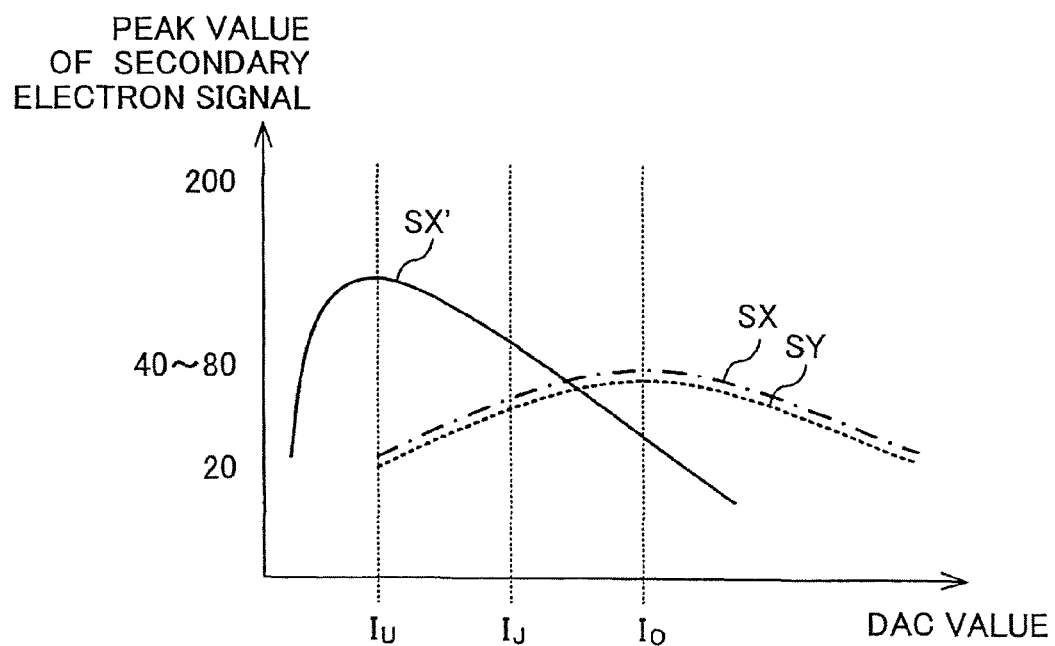

Further, in drawing apparatus 100, when it is estimated that the scanning direction is at 45 degrees to the generating direction of the aberration, further prescanning in the y-axis direction orthogonal to the x-axis direction is performed. FIG. 18B shows curves SX and SY indicating the peak value of the secondary electron signal with respect to the DAC values obtained from the prescan results in the x-axis and y-axis directions, respectively. When the scanning direction is at about 45 degrees to the generating direction of the aberration, the DAC values corresponding to the maximum value of the peak value of the secondary electron signal shown in curves SX and SY are common to $I_o$. In this case, prescan in the x'-axis direction at 45 degrees to the x-axis direction as the scanning direction is performed. The curve SX' is a curve showing the relationship between the peak value of the secondary electron signal obtained by the prescan in the x'-direction and the DAC value. As the curve SX' shows, the DAC value $I_u$ where the peak value of the secondary electron signal is maximized can be obtained by performing the prescan in the x'-axis direction. Herein, the position where the electron beam is converged by the objective lens 19 to which a current of DAC value $I_j$, an averaged value of $I_u$ and $I_o$, is supplied is defined as the focus position.

On the other hand, when it is estimated that the scanning direction is at about 22.5 or about 67.5 degrees to the generating direction of the aberration, since the curve showing the relationship between the DAC value and the secondary electron peak value obtained by the prescan becomes flat, it is difficult to obtain the DAC value when the peak value of the secondary electron signal is maximized. Therefore, in the drawing apparatus 100, when it is estimated that the scanning direction is at about 22.5 or about 67.5 degrees to the generating direction of the aberration, the scanning direction is rotated by, for example, −22.5 degrees with respect to the x-axis, and the same operation as that when the scanning direction is at 0 or 45 degrees to the generating direction is performed to calculate the $I_j$ which is the averaged value of $I_u$ and $I_o$, and the position where the electron beam is converged by the objective lens 19 to which the current of DAC value $I_j$ is supplied may be defined as the focus position.

As described above, in the third embodiment of the present invention, when the focus position of the objective lens 19 is determined, the generating position of the astigmatism occurring in the irradiation system of the drawing apparatus 100 can be roughly determined. Therefore, after step 201 in FIG. 10 is ended, when the reference sample "WP" is scanned, it is possible to accurately correct the astigmatism by setting the scanning direction parallel to or orthogonal to the generating direction of the aberration.

Fourth Embodiment

Conventionally, a master disk of an optical disk such as a compact disk (CD) or a digital versatile disk (DVD) has been manufactured as follows. First, while a disk having a thickness of several millimeters with ultraviolet photosensitive photoresist having the film thickness of 0.1 μm uniformly spin coated thereon is rotated, a spot exposure is performed on the photoresist by converging a light from a gas laser oscillating in the blue or ultraviolet region (such as an Ar or Kr laser: wavelength 350 to 460 nm) onto the disk using an objective lens and turning ON and OFF the laser light. Then fine concave convex patterns of pit and groove is formed by developing the photoresist to manufacture the master disk (resist master disk).

Then, a stamper made of nickel having the thickness of several hundreds of μm (molding die) is manufactured by creating a replica by nickel plating from the resist master disk. By using the stamper, optical disk media are mass-produced. When a playback-only DVD is manufactured, a pit string having a minimum pit length of 0.4 μm, track pitch 0.74 μm is spirally formed on the stamper to respond to the playback-only DVD information signal. Then the conditions of the laser drawing (cutting) when the resist master disk is manufactured are set so that such a pit string is formed on the stamper. When an optical disk medium with a one-sided recording layer having a diameter of 12 cm is manufactured by plastic resin injection molding using the stamper as a metallic mold, the optical disk has the information capacity of 4.7 GB.

To perform the laser drawing (cutting) on the playback-only DVD resist master disk, for example, a Kr ion laser having the wavelength of 413 nm is used. Herein, the minimum pit length "P" to be cutting can be generally approximated by the formula $P=K*(\lambda/NA)$, where $\lambda$ represents the wavelength of the laser, NA represents the numeric aperture, and K represents a process factor (depending on the characteristics of the resist and ranges between 0.8 and 0.9). In this case, when $\lambda=413$ nm, NA=0.9, and K=0.8 are assigned to the formula, P=0.37 μm is obtained, and the minimum pit length of 0.4 μm for playback-only DVD can be recognized.

After DVDs appeared, due to increased demand for increasing the information capacity of an optical disk, an optical disk called Blu-ray disk (hereinafter BD) has appeared. The BD is an optical disk with a recording layer having a diameter of 12 cm formed on one side of the disk and has an information capacity of 25 GB. In the BD, to realize the same processing by a similar signal recording processing method as that available now, it is necessary to reduce the sizes of the minimum pit length and track pitch down to about 0.15 μm (150 nm) and 0.32 μm (320 nm), respectively. The pit width has to be reduced down to, for example, about one-third of the track pitch, for example, about 0.1 μm.

To form such a fine pit, as the above-mentioned approximation formula for obtaining the minimum pit length "P", it is required to reduce the laser wavelength $\lambda$ and increase the NA of the objective lens. However, regarding the NA value of the objective lens, a current value of about 0.9 is thought to be almost the limit value from the viewpoint of the accuracy of the design and manufacturing of the lens. Therefore, in the future, it is absolutely necessary to reduce the wavelength of the laser wavelength $\lambda$.

Herein, for example, when a deep-ultraviolet laser having the wavelength of λ=250 nm, and values of NA=0.9 and K=0.8 are assigned to the above formula, the value P=0.22 μm is calculated. However, it is very difficult to realize the minimum pit length (0.15 μm) and the pit width (about 0.1 μm) corresponding to the information capacity of 25 GB. Therefore, it is very difficult to manufacture a resist master disk of the BD and the subsequent high-density optical disks (for example, using an ultra-resolution image or near-field recording/reproducing) with a laser cutting apparatus using a conventional ultraviolet laser as its light source. Therefore, in the future, it is necessary to apply an electron beam drawing apparatus capable of generating a beam that can expose a finer resist pattern than an ultraviolet laser. In the following, a method of manufacturing an optical disk medium is described.

<Manufacturing a Master Disk>

In the drawing apparatus 100, an electron beam having its spot diameter from about 10 nm to about 200 nm can be obtained by adjusting the intensity of the electron beam and the aperture of the aperture plate 16.

So, when a master disk of an optical information recording medium is manufactured with the drawing apparatus 100, first, it is necessary to determine the electron beam spot in advance in accordance with the pit size to be formed on an optical recording medium finally manufactured. For example, when a pit of the playback-only Blu-ray Disk (BD) is drawn, the spot diameter of the electron beam is set about 100 nm. Then, the astigmatism of the drawing apparatus 100 is corrected using the reference sample "WP" based on the procedure described in the first through third embodiments of the present invention.

<Preparing Resist Substrate>

Figure 19A:
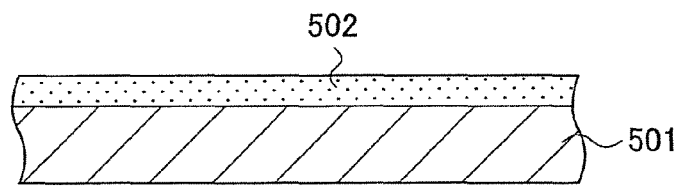
FIGS. 19A through 19E are drawings (No. 1 through 5) illustrating a manufacturing procedure of a master of an optical disk.

As shown in FIG. 19A, resist is applied on a substrate 501 by, for example, a spin coat method, and then baked to form a resist layer 502 made of electron beam resist having uniform film thickness (typically 100 nm or less depending on the recording/reproducing wavelength of the optical disk). It should be noted that, for example, a glass substrate, a quartz substrate, and a silicon wafer may be used as the substrate 501. Further, as the electron beam resist included in the resist layer 502, positive or negative resist may be used. As a master disk of the optical disk, positive resist such as ZEP-520 (manufactured by Nippon Zeon Corporation) is preferable due to its resolution, sensitivity, and easy handling.

As the substrate 501, a nonmagnetic substrate whose surface roughness is fine and having a good flatness is fine, but since the pattern exposure is performed by the drawing apparatus, it is preferable to have electrical conductivity. When a nonconductive material such as glass is used as the substrate 501, preferably, an antistatic agent is applied on the substrate 501, thereby preventing the substrate 501 from being charged when an electron beam is irradiated. Further, as a material for the nonmagnetic substrate, there are many such materials available in the market at low cost, and it is desirable to use a silicon wafer having electrical conductivity.

<Pattern Drawing>

A procedure of drawing a pattern onto the substrate 501 using the drawing apparatus 100 is described below.

Figure 19B:
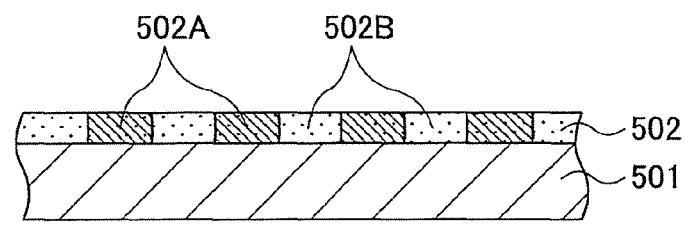

The substrate 501 on which the resist is applied is mounted on the rotary table 31 of the drawing apparatus 100. On the substrate 501, as shown in FIG. 19B, exposure is performed on the shaded regions 502A of the resist layer 502 in the figure.

While the rotary table 31 is rotated and the rotary table is moved at a prescribed speed by the slide unit 33, a electron beam modulated corresponding to a desired pattern is irradiated onto the resist layer. By doing this, a spiral fine pattern is formed in the resist layer 502 on the substrate 501.

It should be noted that since the track of a BD is a spiral track, in this embodiment, the substrate 501 is arranged to be moved by one track pitch while the substrate 501 rotates one turn. Further, when a pit pattern is drawn, the blanking electrode is driven (ON or OFF) at the speed corresponding to the rotating speed (linear speed).

When drawing the pattern on the substrate 501 is finished, the substrate 501 is removed from the rotary table 31.

<Development>

Figure 19C:
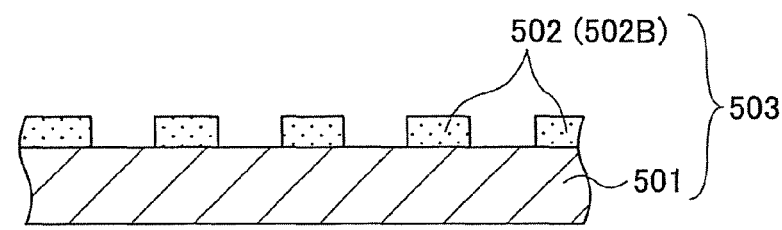

In developing the resist layer 502 of the substrate 501 on which a pattern is drawn as described above, when the resist is positive resist, the regions 502A where electron beam is irradiated as shown in FIG. 19C are removed, and when the resist is negative resist, since non-irradiated regions are removed, a fine pattern of the resist part 502B of the resist layer 500 is formed. By doing this, a master disk (resist master disk) of the substrate 501 on which the fine pattern is formed in the resist layer 502 of the substrate 500 can be obtained.

Figure 19D:
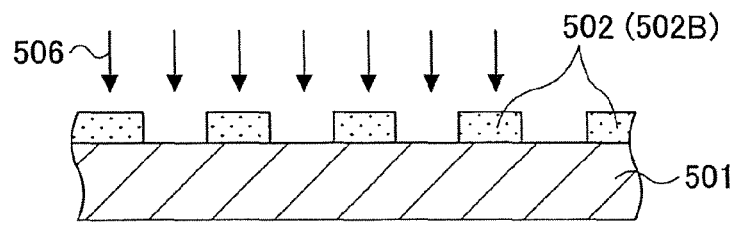
Figure 19E:
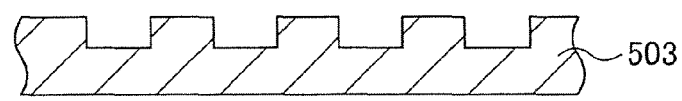

Or, after the development of the resist, further, as shown in FIG. 19D, a concave-convex shape is formed on the substrate 501 by performing a reactive ion etching using reactive gas ion such as $CF_4$ ions 506 (ion etching using such as Ar ions may be used). Then, last, a remaining resist layer 502B is removed by using, for example, an organic solvent so as to directly form a desired fine pattern on the substrate 501 as shown in FIG. 19E. In this way, a master disk (etched master disk) 503 on which a fine pattern is formed in the resist layer 502 of the substrate 501 can also be obtained.

<Manufacturing a Stamper>

Figure 20A:
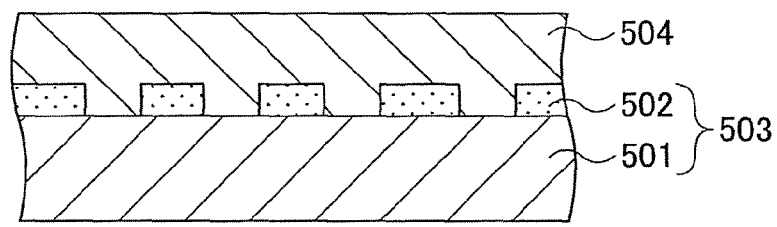
FIGS. 20A through 20B are drawings (No. 1 and 2) illustrating a manufacturing procedure of a stamper of an optical disk.
Figure 20B:

Once the master disk 503 is obtained as described above, a stamper is manufactured from this master disk 503 (herein, the resist master disk is used, but the etched master disk may also be used). Specifically, as shown in FIG. 20A, a thin conductive layer is formed on the master disk 503, and the stamper 504 is formed by performing, for example, nickel plating on the conductive layer. Then, the master disk 503 is removed, thereby obtaining the stamper 504 as shown in FIG. 20B. As a material of the stamper 504, Ni or Ni alloy may be used and various metal film forming methods including non-electrolytic plating, electroforming, sputtering, and ion plating can be applied. The thickness of the stamper 504 is about 300 μm.

It should be noted that, instead of preparing the stamper 504 from the master disk 503, a master stamper for duplicating plural stampers may be first prepared so as to duplicate plural stampers from the master stamper (in this case, since concave-convex pattern is reversed between the master stamper and the stamper 503, another transferring stamper is necessary in the middle).

<Manufacturing a Medium>

Figure 21A:
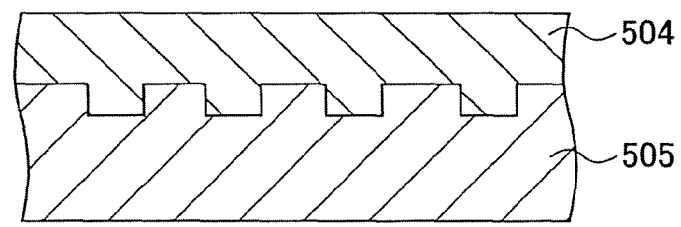
FIGS. 21A through 21B are drawings (No. 1 and 2) illustrating a manufacturing procedure of an optical disk medium.
Figure 21B:
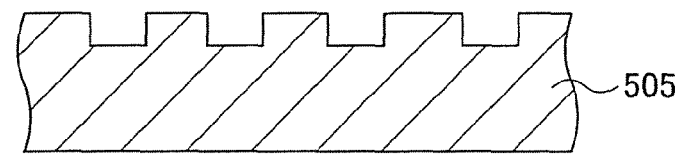

The pattern of the stamper 504 is transferred to a resin 505 as shown in FIG. 21A by a method such as injection molding or a 2P method. By doing this, an optical disk medium 505 having a fine concave-convex pattern shown in FIG. 21B is obtained. More precisely, the object 505 is a substrate of the optical disk medium. By forming, for example, a reflection film on the fine concave-convex pattern of the optical disk media substrate, the optical disk medium is manufactured.

As described above, in an optical disk medium according to this embodiment of the present invention, a master disk is manufactured by using the drawing apparatus 100 whose magnitude of the astigmatism is restricted to a prescribed value or less. Therefore, the fluctuation of the pattern shapes on the master disk can be drastically minimized compared with the conventional master disks. Accordingly, the fluctuation of the stamper and the medium manufactured from the master disk can be reduced. Specifically, conventionally, since the astigmatism cannot be quantitatively treated, it depends on personal ability to determine the existence of the astigmatism. Because of this feature, the remaining magnitude of astigmatism largely varies depending on who makes the determination and the fluctuation of the pattern shapes of the master disk is remarkable. However, according to this embodiment of the present invention, since the magnitude of the astigmatism is restricted to a certain value or less, the remaining magnitude of the astigmatism does not largely vary depending on who corrected the astigmatism.

Fifth Embodiment

In a hard disk drive, there are regions provided at the same angle interval in 360 degrees during one rotation of disk where, for example, a tracking servo signal, an address information signal, and a reproduction clock signal (hereinafter preformat information signals) are recorded. Because of the regions, a magnetic head reproduces those signals at a prescribed interval and clarifies the position of the magnetic head, thereby accurately scanning on the right track while correcting the displacement in the diameter direction of the magnetic disk when necessary.

Figure 22:
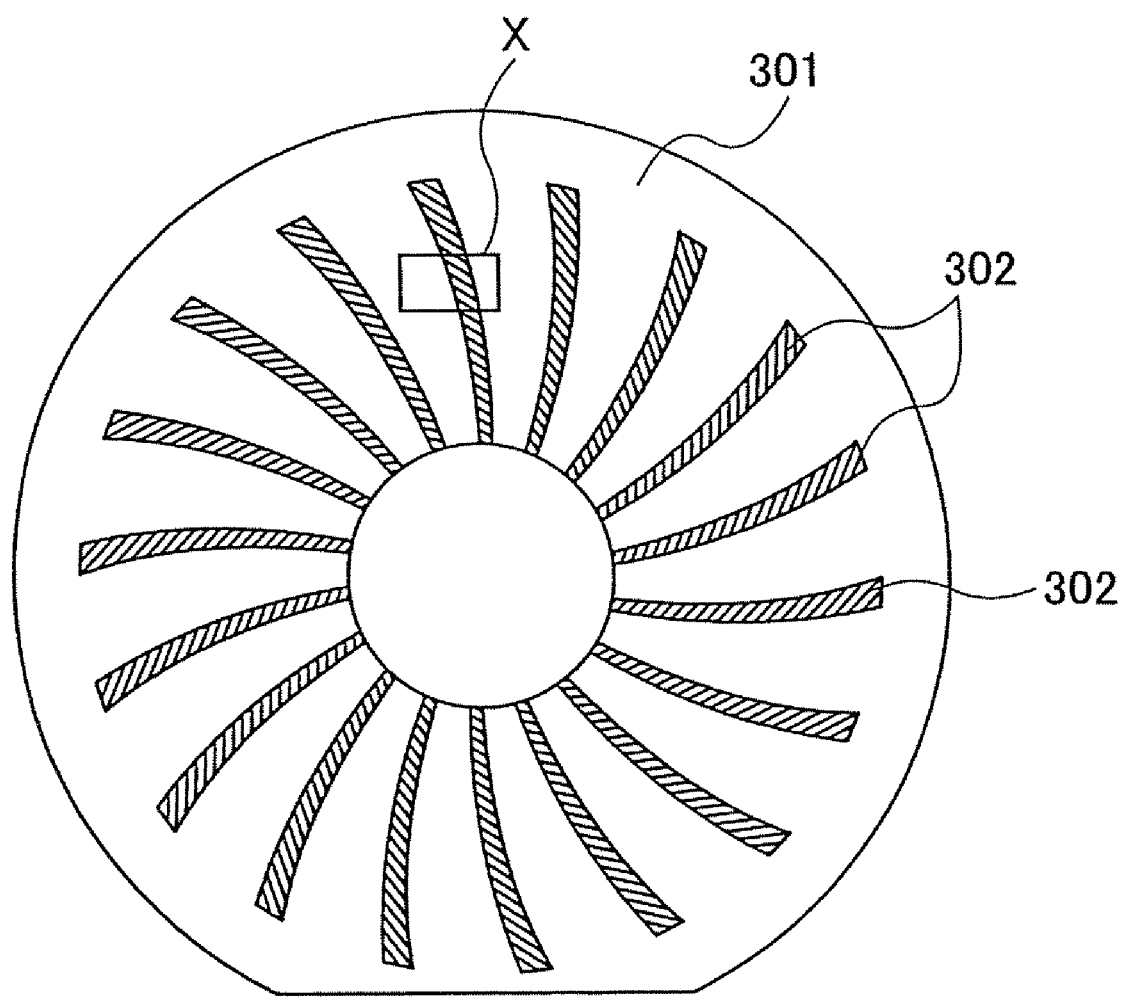
FIG. 22 is a drawing showing an exemplary configuration of a hard disk.

FIG. 22 shows a configuration of a hard disk. As shown in FIG. 22, in the hard disk, there are regions 302 provided at a prescribed angle interval each have a magnetic thin film pattern corresponding to the preformat information signal formed on the surface of a substantially disk-shaped substrate 301. FIG. 23 is an enlarged drawing of a part (region X shown in FIG. 22) of the region 302. In FIG. 23, the horizontal direction on the paper indicates the scanning direction, and the vertical direction on the paper indicates the circumference direction of the track. As shown in FIG. 23, each region of the tracking servo signal, the address information signal, the clock signal, and a phase servo signal are sequentially arranged in the circumference direction of the track. In FIG. 23, cross-hatching regions indicate the magnetic thin film pattern. Further, the pattern of the phase servo signal is obliquely crossing over plural recording tracks with respect to the direction of the tracks and extending.

For example, in a current hard disk drive, after a magnetic disk and a magnet head are embedded into the drive, the tracking servo signal, the address information signal, the reproduction clock signal and the like are (magnetically) recorded by a dedicated magnetic head in the drive using a dedicated servo track recording device.

In the technology in which the preformat recording is performed by a dedicated magnetic head in the drive using a dedicated servo track recording device, there are problems that it takes a long time to perform the preformat recording and the cost of performing the preformat recording is high because the dedicated servo track recording device is expensive. Further, in the future, when the recording density of a hard disk is increased or the diameter of the hard disk is increased, the recording time becomes further longer and the cost of the recording device becomes more expensive.

The fact that the regions for the preformat signal are necessary and that the necessary pattern shape is substantially the same are unchanged among the current hard disks and the future hard disks that are Discrete Track Media (DTM) and Bit Pattern Media (BPM) as described later. However, the pattern size is expected to be gradually reduced, and the minimum size, for example, in the BPM is expected to be about 20 nm, while being about 100 to about 200 nm in current hard disks.

To solve the problem of using the dedicated servo track recording device, there is a method in which fine patterns corresponding to the preformat signal patterns are manufactured in advance and are transferred onto each hard disk medium (substrate) (a magnetic transfer recording method).

The magnetic transfer recording method is based on a technique in which after a surface of a master information carrier where a magnetic thin film pattern corresponding to the preformat information signal is formed on the surface of the substrate is tightly pressed onto a surface of a magnetic recoding device, the magnetic pattern corresponding to the magnetic thin film pattern is transfer recorded on the magnetic recording medium by magnetizing the magnetic thin film pattern formed on the master information carrier by applying an external magnetic field.

The master information carrier substrate for magnetic transfer is thought to be manufactured from a master disk on which a resist concave-convex pattern corresponding to the information to be transferred is formed similar to the case of an optical disk, or from a stamper manufactured based on the master disk.

The pattern size of the preformat signal for current hard disks is about 100 to 200 nm, which is beyond the reach of the laser beams. Electron beams are capable of drawing about 10 nm size pattern. Instead of a laser beam, an electron beam can be used to form a master disk corresponding to the preformat signal pattern of the hard disk. In the following, a method of manufacturing a hard disk is described.

<Manufacturing a Master Disk>

In the drawing apparatus 100 in FIG. 1, the spot diameter from about 10 nm to 200 nm can be obtained by adjusting the beam current of the electron source 11 and the aperture of the aperture plate 16.

In a case where the preformat signal pattern of the current hard disks is drawn using the drawing apparatus 100, the spot diameter of the electron beam is set to about 100 nm. Then, the astigmatism of the drawing apparatus 100 is corrected using the reference sample "WP" in the procedure described in the first through the third embodiments of the present invention.

<Preparing Resist Substrate>

Figure 24A:
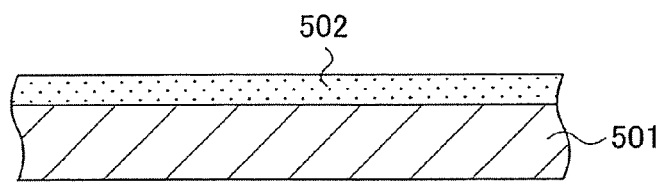
FIGS. 24A through 24H are drawings (No. 1 through 8) illustrating a manufacturing procedure of a master of a hard disk including DTM and BPM.

As shown in FIG. 24A, resist is applied on a substrate 501 by, for example, a spin coat method, and then baked to form a resist layer 502 made of electron beam resist having uniform film thickness (typically 100 nm or less). It should be noted that, for example, a glass substrate, a quartz substrate, and a silicon wafer may be used as the substrate 501. Further, as the electron beam resist included in the resist layer 502, positive or negative resist may be used. For the use of the magnetic transfer master disk, positive resist such as ZEP-520 (manufactured by Nippon Zeon Corporation) is preferable due to its resolution, sensitivity, easy-handling.

As the substrate 501, a nonmagnetic substrate whose surface roughness is fine and having a good flatness is fine, but since the pattern exposure is performed by the drawing apparatus, it is preferable to have electrical conductivity. When a nonconductive material such as glass is used, preferably, an antistatic agent is applied on the substrate 501, thereby preventing the substrate 501 from being charged when an electron beam is irradiated. Further, as a material for a nonmagnetic substrate, there are many such materials available in the market at low cost, and it is desirable to use a silicon wafer having electrical conductivity.

<Pattern Drawing>

A procedure of drawing a pattern onto the substrate 501 using the drawing apparatus 100 is described blow.

Figure 24B:
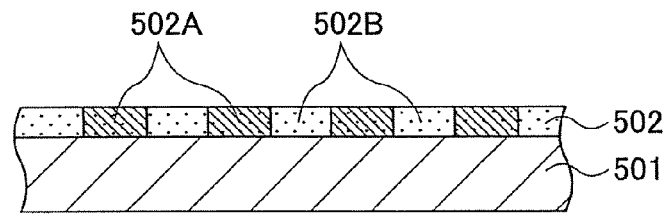

The substrate 501 on which the resist is applied is mounted on the rotary table 31 of the drawing apparatus 100. On the substrate 501, as shown in FIG. 24B, exposure is performed on the shaded regions 502A of the resist layer 502 in the figure.

A desired pattern is drawn on each track of the resist layer 502 on the substrate 501 by rotating the rotary table 31 and irradiating an electron beam modulated corresponding to the preformat transfer information such as the servo signal. Since the hard disk includes concentric patterns, after completion of drawing of one track, the slide unit 33 is moved by the track pitch. In this case, to form a desired pattern, it is necessary to jointly operate the blanking electrode 15, the scanning electrode 18, the rotary table unit 30, and the slide unit 33 of the irradiation apparatus 10.

When drawing the pattern on the substrate 501 is finished, the substrate 501 is removed from the rotary table 31.

<Development>

Figure 24C:
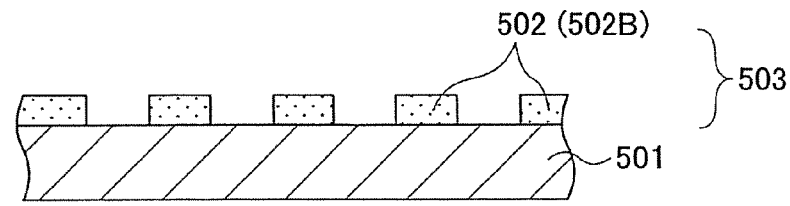

In developing the resist layer 502 of the substrate 501 on which a pattern is drawn as described above, when the resist is positive resist, the regions 502A where electron beam is irradiated as shown in FIG. 24C are removed, and when the resist is negative resist, since non-irradiated regions are removed, a fine pattern of the rest part 502B of the resist layer 500 is formed. By doing this, a master disk (resist master disk) of the substrate 501 on which the fine pattern is formed in the resist layer 502 of the substrate 500 can be obtained.

Figure 24D:
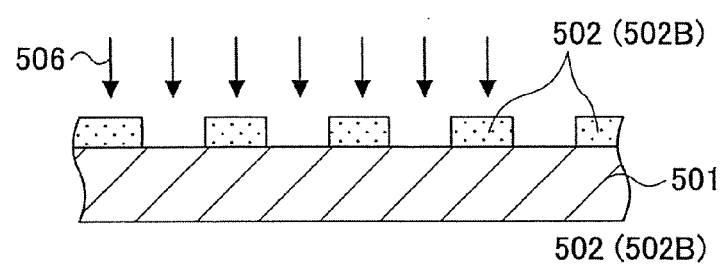
Figure 24E:
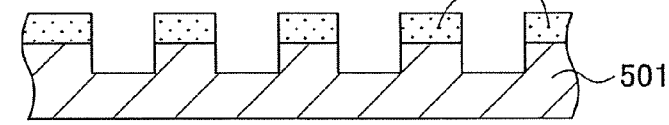
Figure 24F:
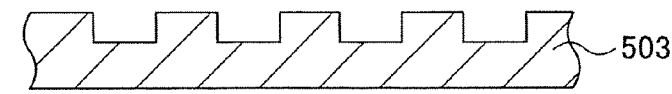

Or, after the development of the resist, further, as shown in FIG. 24D, a concave-convex shape is formed on the substrate 501 by performing reactive ion etching using reactive gas ion such as $CF_4$ ions 506 (ion etching using such as Ar ions may be performed) as shown in FIG. 24E. Then, last, a remaining resist layer 502B is removed by using, for example, an organic solvent so as to directly form a desired fine pattern on the substrate 501 as shown in FIG. 24F. In this way, a master disk (etched master disk) 503 on which a fine pattern is formed in the resist layer 502 of the substrate 501 can also be obtained.

<Manufacturing a Stamper>

Figure 25A:
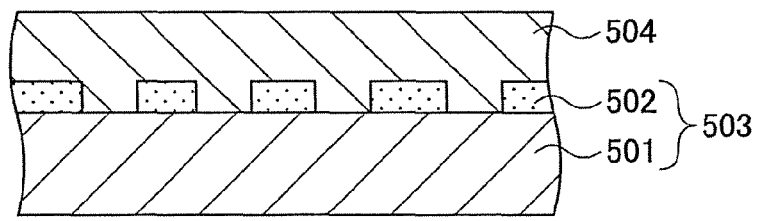
FIGS. 25A through 25C are drawings (No. 1 through 3) illustrating a manufacturing procedure of a stamper of a hard disk master including the DTM and BPM.
Figure 25B:
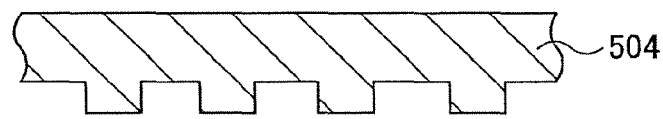
Figure 25C:
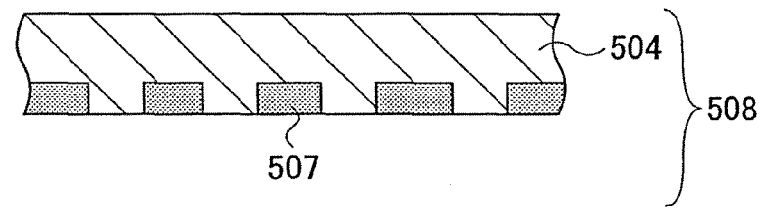

Once the master disk 503 is obtained as described above, a stamper is manufactured from this master disk 503 (herein, the resist master disk is used, but the etched master disk may also be used). Specifically, as shown in FIG. 25A, a thin conductive layer is formed on the master disk 503, and the stamper 504 as shown in FIG. 25B is formed by performing, for example, nickel plating on the conductive layer. Then, the master disk 503 is removed, thereby obtaining the stamper 504. As a material of the stamper 504, Ni or Ni alloy may be used and various metal film forming methods including non-electrolytic plating, electroforming, sputtering, and ion plating can be applied. The depth (height of the protrusion) of the concave-convex pattern of the stamper 504 is about several hundreds nanometers.

It should be noted that, instead of preparing the stamper 504 from the master disk 503, a master stamper for duplicating plural stampers may be first prepared so as to duplicate plural stampers from the master stamper (in this case, since concave-convex pattern is reversed between the master stamper and the stamper 503, another transferring stamper is necessary in the middle).

<Manufacturing Master Information Carrier>

A magnetic thin film 507 made of, for example, cobalt is formed on the concave-convex pattern of the stamper 504 by a general thin film forming method such as sputtering. Then, the magnetic thin film formed on the convex sections is removed by a polishing process such as Chemical Mechanical Polishing (CMP) to obtain the master information carrier 508 on which a desired magnetic thin film pattern is formed as shown in FIG. 25O.

Figure 24G:
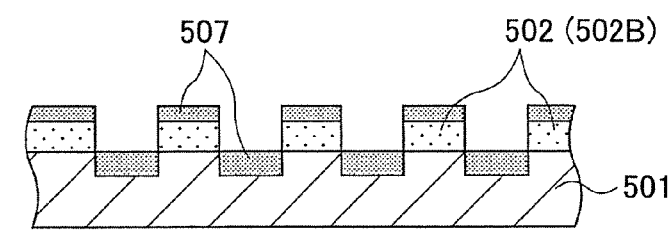
Figure 24H:
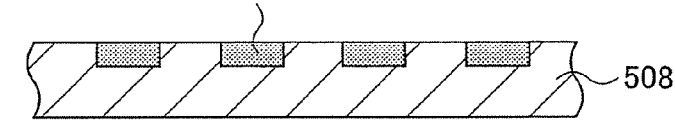

It should be noted that the magnetic thin film 507 made of, for example, cobalt is formed on the substrate 501 without removing the remaining resist (remaining resist layer) 502B as shown in FIG. 24G after a concave-convex pattern is formed on the substrate 501 by etching as shown in FIG. 24E. Then, last, the remaining resist layer 502 B and the magnetic thin film accumulated on the remaining resist layer are removed with, for example, organic solvent to obtain the master information carrier 508 on which a desired magnetic thin film pattern is formed as shown in FIG. 24H. In this process, it is not necessary to manufacture a stamper.

The method of forming the magnetic thin film is not limited to sputtering, and general thin film forming methods conventionally conducted such as the vacuum deposition method, the ion plating method, the CVD method, and a plating method may be used. Also, the magnetic thin film 507 constitutes the magnetic thin film pattern formed on the master information carrier. The material of the magnetic think film 507 is not limited to Cobalt, and various types of magnetic materials including a hard magnetic material, a semi-hard magnetic material, and a soft magnetic material may be used.

Further, in this case, the magnetic thin film is formed on the concave sections. However, since the master information carrier works whether the magnetic thin film is formed on only convex sections or both concave and convex sections, various methods of forming the magnetic thin film can be used.

Further, though the master information carrier may be manufactured from either an etched master disk or a stamper, since a master disk is made of a material which is easily broken such as silicon and, on the other hand, a stamper is made of a metal, generally it is preferable to manufacture a master information carrier from a stamper except when performing magnetic transfer only a limited number of times.

<Manufacturing Medium>

Figure 26A:
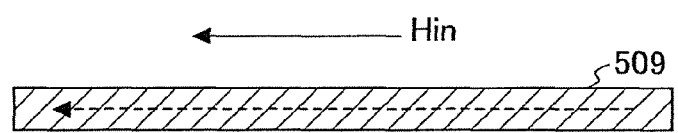
FIGS. 26A through 26C are drawings (No. 1 through 3) illustrating a manufacturing procedure of a hard disk medium by a magnetic transfer recording method.
Figure 26B:
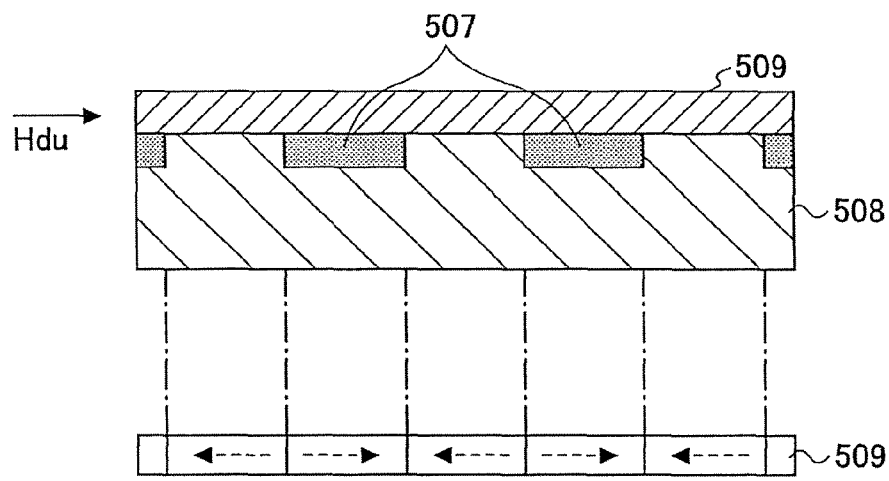
Figure 26C:
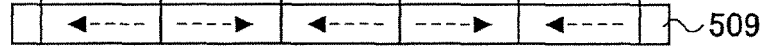

The magnetic transfer to a longitudinal magnetic recording medium is described with reference to FIGS. 26A through 26C. It should be noted that the magnetic recording medium in FIGS. 26A through 26C show only one-sided magnetic recording sections. First, as shown in FIG. 26A, initial magnetization (DC magnetization) is previously performed by applying initial static magnetic field "Hin" to one direction of the track directions of the magnetic recording medium 509 (slave of the transferred side). Then, as shown in FIG. 26B, the magnetic recording surface of the magnetic recording medium 509 is closely attached to the fine concave-convex pattern surface of the master information carrier 508, and the magnetic transfer is performed by applying transfer magnetic field "Hdu" to the magnetic recording medium 509 in the track direction opposite to the direction to which the initial static magnetic field "Hin" is applied. The transfer magnetic field "Hdu" is absorbed into the magnetic thin film 507 of the concave sections, therefore the magnetization of the sections are not inversed. But the magnetization of the other section are inversed. As a result, the magnetic pattern corresponding to the concave-convex pattern of the master information carrier 508 is transferred to the magnetic recording media 509 as shown in FIG. 26C.

Though it is not shown in the figures, it should be noted that even when the magnetic thin film is formed on only the convex sections or both convex and concave sections, the magnetic pattern corresponding to the concave-convex pattern of the master information carrier is similarly transfer recorded. Also, though the magnetic recording medium 509 generally includes several layers of, for example, magnetic layers on a substrate made of, for example, glass or aluminum, those are abbreviated herein for explanation purposes.

When the magnetic transfer is performed onto a perpendicular magnetic recording medium, substantially the same master information carrier 508 as used for the longitudinal magnetic recording medium is used. In perpendicular recording, first, the magnetization of the magnetic recording medium 509 is arranged in the direction parallel to one of the perpendicular directions by performing the initial DC magnetization. Then after the magnetic recording medium 509 is closely attached to the master information carrier 508, the magnetic transfer is performed by applying a transfer magnetic field to the direction opposite to the direction of the initial DC magnetization to record the magnetic pattern corresponding to the concave-convex pattern onto the magnetic recording medium 509.

As described above, in a recording medium (hard disk) according to this embodiment of the present invention, a master disk is manufactured by using the drawing apparatus 100 whose magnitude of the astigmatism is restricted to a prescribed value or less. Therefore, the fluctuation of the pattern shapes on the master disk can be drastically minimized compared with the conventional master disks. Accordingly, the fluctuation of the stamper and the medium manufactured from the master disk can be reduced. Specifically, conventionally, since the astigmatism cannot be quantitatively treated, it depends on personal ability to determine the existence of the astigmatism. Because of this feature, the remaining magnitude of astigmatism largely varies depending on who made the determination and the fluctuation of the pattern shapes of the master disk is remarkable. However, according to this embodiment of the present invention, since the magnitude of the astigmatism is restricted to a certain value or less, the remaining magnitude of the astigmatism does not largely vary depending on who corrected the astigmatism.

Sixth Embodiment

The DTM and the BPM are hard disks having much higher recording density than current disks. Though it is unchanged that, for example, the servo signal pattern for tracking the magnetic head is still necessary, the DTM and the BPM are preformat media formed during the manufacturing process of the media without using a servo track recording device as described below.

When the recording density of the hard disk is increased and the recording density reaches, for example, 100 Gbits/inch$^2$ or more, the broadening of the magnetic field from the side surfaces of the magnetic head becomes a problem. The broadening of the magnetic field cannot be reduced less than a certain value even when the size of the head becomes smaller. As a result, the phenomenon of writing to an adjacent track (side writing) and erasing the data already recorded thereon may occur. In addition, when reading, not only a signal of the data track to be normally read but also an unnecessary signal of the adjacent track is also read, causing the crosstalk phenomenon.

Figure 27:
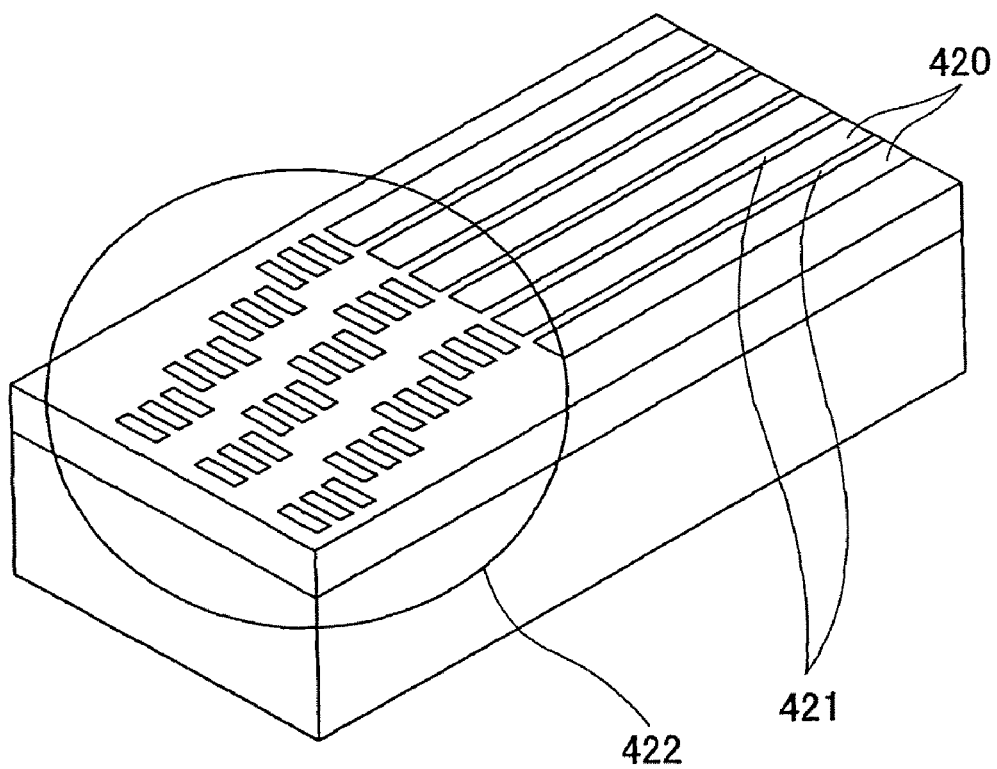
FIG. 27 is a drawing illustrating the DTM.

To realize further higher density while the influences of, for example, the side writing and the crosstalk are reduced, the Discrete Track Media (DTM) is being proposed. In the DTM, as shown in FIG. 27, data tracks 420 are physically and magnetically separated from each other by grooves 421. Also, in the DTM, magnetic material remains only in the data track 420 to be recorded and nonmagnetic material is supplied in the grooves 421 between the tracks. Further, a pattern similar to the patterns shown in, for example, FIG. 22 is formed in preformat signal pattern sections 422 for recording, for example, the servo signal as magnetic material like the data tracks 420.

The track pitch of the DTM is about 50 nm to about 100 nm, and the pattern size of the preformat signal is almost the same as that of the track pitch. Therefore, an electron beam drawing apparatus is being used for forming patterns of those data tracks and preformat signal patterns. As a medium having higher recoding density (for example, 1 Tbits/inch$^2$) than that of the DTM, Bit Pattern Media (BPM) in which magnetic particles are arranged in order along the data tracks and 1 bit is recorded in one magnetic particle is being proposed.

Figure 28:
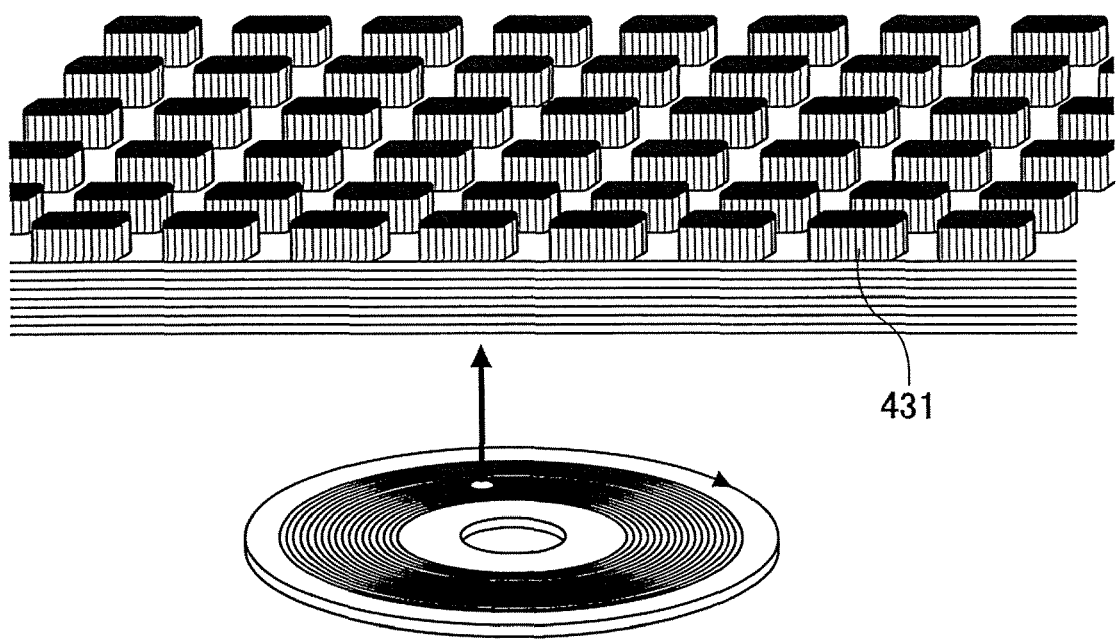
FIG. 28 is a drawing illustrating the BPM.

As shown in FIG. 28, the BPM is a medium where each magnetic particle 431 is physically and magnetically isolated from the other magnetic particles like an island. In the BPM, nonmagnetic material is supplied among the magnetic particles excluding the magnetic particle sections. Though it is not shown in the figures, similar to the DTM, the BPM includes the preformat signal pattern sections.

The track pitch of the BPM is about 20 nm to about 50 nm and the sizes of the magnetic particles and the preformat pattern signal pattern are also similar to that of the track pitch, so that an electron beam drawing apparatus is being used for forming those patterns. When Heat Assisted Magnetic Recording (HAMR) using a laser spot irradiation as well in magnetic recording and the BPM are jointly used, further higher density is thought to be achievable, and then, the drawing scale of the BPM is estimated to be 10 nm range which can be supported by an electron beam drawing apparatus.

It is unchanged that, for example, the servo signal pattern for tracking the magnetic head is still necessary in both the DTM and the BPM. The DTM and the BPM are preformat media in which the data tracks of the DTM and the magnetic particles of the BPM are similarly configured so that the patterns are formed when the data tracks and the magnetic particles are processed. Therefore, it is effective since the servo information writing operation on each medium is not necessary.

The DTM and the BPM can be manufactured by similar processes since the differences are limited to the shapes of actual data recording sections (DTM=continuous track, BPM=line of discrete magnetic particles) and the sizes of the pattern (the size of BPM pattern is smaller). In the following, the manufacturing method is describe.

<Manufacturing a Master Disk>

In the drawing apparatus 100 in FIG. 1, the spot diameter from about 10 nm to 200 nm can be obtained by adjusting the beam current amount of the electron source 11 and the aperture of the aperture plate 16.

When the preformat signal pattern of the DTM is drawn using the drawing apparatus 100, the spot diameter of the electron beam is set to about 50 nm. Or when the preformat signal pattern of the BPM is drawn, the spot diameter of the electron beam is set to about 20 nm. Then, the astigmatism of the drawing apparatus 100 is corrected using the reference sample "WP" in the procedure described in the first through the third embodiments of the present invention.

<Preparing Resist Substrate>

As shown in FIG. 24A, resist is applied on a substrate 501 by, for example, a spin coat method, and then baked to form a resist layer 502 made of electron beam resist having uniform film thickness (about 50 nm to about 100 nm). For example, a glass substrate, a quartz substrate, or a silicon wafer may be used as the substrate 501. Further, as the electron beam resist included in the resist layer 502, positive or negative resist may be used. For the use of the master disk of the DTM and the BPM, positive resist such as PMMA (manufactured by Tokyo Oyo Kagaku) is preferable due to its resolution, sensitivity, easy-handling.

As the substrate 501, a nonmagnetic substrate whose surface roughness is fine and having a good flatness is fine, but since the pattern exposure is performed by the electron beam drawing apparatus, it is preferable to have electrical conductivity. When a nonconductive material such as glass is used, preferably, an antistatic agent is applied on the substrate 501, thereby preventing the substrate 501 from being charged when an electron beam is irradiated. Further, as a material for the nonmagnetic substrate, there are many such materials available on the market at low cost, and it is desirable to use a silicon wafer having electrical conductivity.

<Pattern Drawing>

A procedure of drawing a pattern onto the substrate 501 using the drawing apparatus 100 is described below.

The substrate 501 on which the resist is applied is mounted on the rotary table 31 of the drawing apparatus 100. On the substrate 501, as shown in FIG. 24B, exposure is performed to the shaded regions 502A of the resist layer 502 in the figure.

A desired pattern is drawn on each track of the resist layer 502 on the substrate 501 by rotating the rotary table 31 and irradiating an electron beam modulated corresponding to the preformat information such as the servo signal. In addition to the pattern of the preformat information, continuous data tracks of the DTM or regular pit lines of the BPM are formed. Further, since the hard disk includes concentric patterns, after completion of drawing of one track, the slide unit 33 is moved by the track pitch. In this case, to form a desired pattern, it is necessary to jointly operate the blanking electrode 15, the scanning electrode 18, the rotary table unit 30, and the slide unit 33 of the irradiation apparatus 10.

When drawing the pattern on the substrate 501 is finished, the substrate 501 is removed from the rotary table 31.

<Development>

In developing the resist layer 502 of the substrate 501 on which a pattern is drawn as described above, when the resist is positive resist, the regions 502A where electron beam is irradiated as shown in FIG. 24C are removed, and when the resist is negative resist, since non-irradiated regions are removed, a fine pattern of the rest part 502B of the resist layer 500 is formed. By doing this, a master disk (resist master disk) of the substrate 501 on which the fine pattern is formed in the resist layer 502 of the substrate 500 can be obtained.

Or, after the development of the resist, further, as shown in FIG. 24D, a concave-convex shape is formed on the substrate 501 by performing reactive ion etching using reactive gas ions such as $CF_4$ ions 506 (ion etching using such as Ar ions may be performed) as shown in FIG. 24E. Then, last, a remaining resist layer 502B is removed by using, for example, an organic solvent so as to directly form a desired fine pattern on the substrate 501 as shown in FIG. 24F. By doing this way, a master disk (etched master disk) 503 on which a fine pattern is formed on the substrate 501 can also be obtained.

<Manufacturing a Stamper>

Once the master disk 503 is obtained as described above, a stamper is manufactured from this master disk 503 (herein, the resist master disk is used, but the etched master disk may also be used). Specifically, as shown in FIG. 25A, a thin conductive layer is formed on the master disk 503, and the stamper 504 is formed by performing, for example, nickel plating on the conductive layer. Then, the master disk 503 is removed, thereby obtaining the stamper 504. As a material of the stamper 504, Ni or Ni alloy may be used and various metal film forming methods including nonelectrolytic plating, electroforming, sputtering, and ion plating can be applied. The depth (height of the protrusion) of the concave-convex pattern of the stamper 504 is about several hundreds nanometers.

It should be noted that, instead of preparing the stamper 504 from the master disk 503, a master stamper for duplicating plural stampers may be first prepared so as to duplicate plural stampers from the master stamper (in this case, since concave-convex pattern is reversed between the master stamper and the stamper 503, another transferring stamper is necessary in the middle).

<Manufacturing Medium>

A method of manufacturing the magnetic recording medium 509 using the stamper 504 is described with reference to the FIGS. 29A through 29D.

Figure 29A:
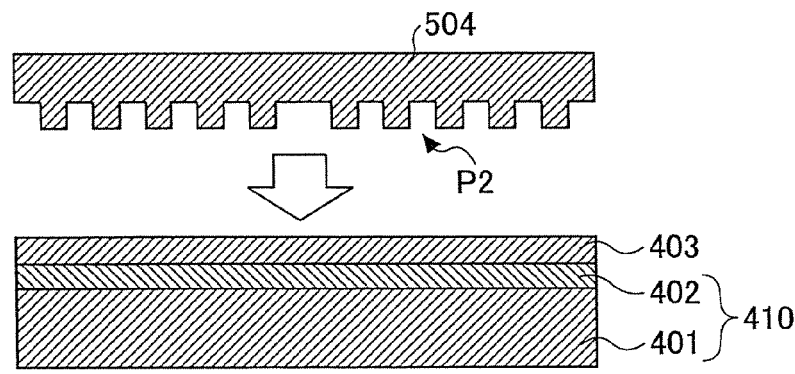
FIGS. 29A through 29D are drawings (No. 1 through 3) illustrating a manufacturing procedure of the DTM and the BPM.
Figure 29B:
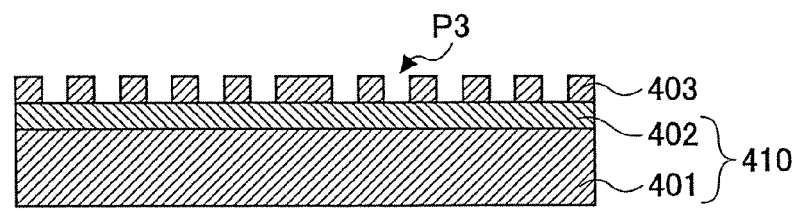

First, as shown in FIG. 29A, while heating an intermediate body 410 on which a resin layer 403 is formed, the stamper 504 is pressed onto the intermediate body 410 by the nano-imprinting method. Then, the concave-convex pattern "P2" of the stamper 504 is transferred to the resin layer 403 and a concave-convex pattern "P3" is formed on the intermediate body 410. In this case, the intermediate body 410 is an intermediate body for manufacturing the magnetic recording medium 509 and includes a disk-shaped substrate 401 (for example, glass or aluminum) and a magnetic layer 402 formed on the substrate 401. It should be noted that, for example, a underlayer, a soft magnetic layer, an alignment layer, a recording layer (magnetic layer 402), and a protection layer may be accumulated on the substrate 401 in an actual intermediate body 410, but the description and the graphic display of those are herein abbreviated.

When the concave-convex pattern "P2" of the stamper 504 is transferred to the resin layer 403 by the nano-imprinting method, heat is used to harden the resin layer 403. UV-hardened resin may alternatively be used and hardened by irradiating UV light. In this case, however, it is preferable to use an etched master disk made from a substrate 501 that passes UV light such as quartz instead of the stamper 504.

Figure 29C:
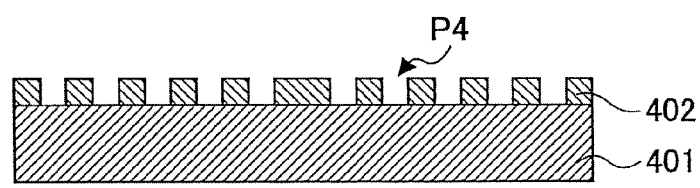

Next, the intermediate body 410 is etched (for example, reactive ion etching) using the concave-convex pattern "P3" as a mask. In this case, the magnetic layer 402 is exposed from the bottom surface of the concave sections of the concave-convex pattern "P3". Then, further etching is performed to form a concave-convex pattern "P4" in the magnetic layer 402 as shown in FIG. 29C.

Figure 29D:
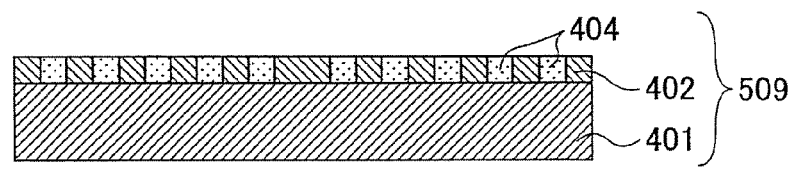

Then, as shown in FIG. 29D, nonmagnetic material 404 is supplied in the concave sections of the concave-convex pattern "P4". Further, the magnetic layer 402 (top of the convex sections of the concave-convex pattern "P4") is exposed by, for example, a polishing process (such as CMP method), and then, a protection layer is formed on the surface of the magnetic layer 402 to complete the magnetic recording medium 509. It should be noted that the preformat signal pattern and the data track pattern may be formed in the same process at the same time.

As described above, in the recording medium (DTM, BPM) according to this embodiment of the present invention, a master disk is manufactured by using the drawing apparatus 100 whose magnitude of the astigmatism is restricted to a prescribed value or less. Therefore, the fluctuation of the pattern shapes on the master disk can be drastically minimized compared with the conventional master disks. Accordingly, the fluctuation of the stamper and the medium manufactured from the master disk can be reduced. Specifically, conventionally, since the astigmatism cannot be quantitatively treated, it depends on personal ability to determine the existence of the astigmatism. Because of this feature, the remaining magnitude of astigmatism largely varies depending on who makes the determination and the fluctuation of the pattern shapes of the master disk is remarkable. However, according to this embodiment of the present invention, since the magnitude of the astigmatism is restricted to a certain value or less, the remaining magnitude of the astigmatism does not largely vary depending on who corrected the astigmatism.

In the sixth embodiment, a method of manufacturing the DTM/BPM medium is described. Besides the DTM/BPM, the nano-imprinting method is usually used to manufacture a fine so-called nano structure. In the nano-imprinting method, as described above, a stamper (or may often be called "template" as a nano-imprinting technology term) is necessary. Further, an electron beam drawing apparatus is necessary to manufacture a pattern master which is necessary to manufacture the stamper. The combination of manufacturing a pattern master using an electron beam drawing apparatus, the stamper made from the pattern master, and the nano-imprinting method is also applicable in manufacturing the following devices including, but not limited to, a deflection plate device for liquid crystal, micro lens array for CCD/CMOS sensor, photonic crystal for high brightness LED, and a thin film head. Further, so called self-organizing function of, for example, block copolymer may be added to the nano pattern structure manufactured as described above to manufacture, for example, an antireflective structure of LED, a biochip, and a semiconductor insulation film.

It should be noted that, in the descriptions of the above embodiments, the drawing apparatus 100 using an electron beam is used. However, since the drawing apparatus using an electron beam and the electron microscope generally have a similar structure, the present invention is also applicable to the electron microscope forming an image using a secondary electron beam.

Further, in the above embodiments, the secondary electron signal is generated based on the secondary electrons generated from the reference sample "WP" and detected by the electron detector 21. However, in addition to the secondary electrons, reflected electrons reflected off the reference sample "WP" may be detected to generate a reflected electron signal, or a transmitted electron signal based on the transmitted electrons transmitted through the reference sample "WP" may be used.

INDUSTRIAL APPLICABILITY

As described above, the aberration evaluation pattern and the aberration evaluation method according to the present invention are well suited to evaluate astigmatism. The aberration correction method according to the present invention is well suited to correct aberration of an irradiation system. The electron beam drawing apparatus according to the present invention is well suited to pattern drawing using an electron beam. The electron microscope according to the present invention is well suited to the observation of a sample.

The present invention is not limited to the above-mentioned embodiments, and variations and modifications may be made without departing from the scope of the present invention.

The present application is based on and claims the benefit of priority of Japanese Patent Application Nos. 2006-356875 filed on Dec. 29, 2006 and 2007-306627 filed on Nov. 27, 2007, the entire contents of which are hereby incorporated by reference.

The invention claimed is:

1. An aberration evaluation method for evaluating aberration of an irradiation system based on an image obtained by scanning an electron beam onto an aberration evaluation pattern, the irradiation system emitting the electron beam, the aberration evaluation method comprising:

a focus setting step of setting a focus position of the irradiation system onto the aberration evaluation pattern, wherein the aberration evaluation pattern includes a periodical structure having a prescribed line width and a prescribed distance between the lines, the periodical structure being provided on the same plane and formed outward from a center that is an irradiated position of the electron beam when the electron beam is not deflected, the periodical structure being formed to extend 360 degrees around the periphery of the center and has either a concentric-circle figure or a spiral figure whose center is positioned at the center that is the irradiated position of the electron beam when the electron beam is not deflected, wherein the focus position is set onto the aberration evaluation pattern based on an electron signal obtained by scanning an underfocused electron beam onto the aberration evaluation pattern and an electron signal obtained by scanning an overfocused electron beam onto the aberration evaluation pattern, wherein the focus setting step includes:

a first substep of scanning an underfocused electron beam and an overfocused electron beam onto the aberration evaluation pattern in a third and a fourth directions, the third and fourth directions being different from each other; and a second substep of setting the focus position onto the aberration evaluation pattern based on the maximum value of an electron signal obtained by scanning in the third direction and the maximum value of an electron signal obtained by scanning in the fourth direction, wherein, the first substep includes:

a current value difference calculation step of calculating a difference between a first current value and a second current value, the first current value corresponding to the focus position of the irradiation system when the electron signal obtained by scanning in the third direction becomes maximum, the second current value corresponding to the focus position of the irradiation system when the electron signal obtained by scanning in the fourth direction becomes maximum, and a determination step of determining whether the difference between the first current value and the second current value is equal to or less than a predetermined value, wherein, in the second substep, when determining that the difference between the first current value and the second current value is equal to or less than a predetermined value, the focus position onto the aberration evaluation pattern is set based on the maximum value of an electron signal obtained by scanning in a fifth direction and the maximum value of an electron signal obtained by scanning in the fourth direction, the fifth direction being different from the third direction; and an evaluation step of evaluating aberration of the irradiation system based on electron signals obtained by scanning the electron beam onto the aberration evaluation pattern onto which the focus position of the irradiation system is set in a first direction and a second direction orthogonal to the first direction.

2. The aberration evaluation method according to claim 1, further comprising: a determining step of determining the direction of the aberration of the irradiation system with respect to the first direction based on a scanning result in the third and the fourth directions.

3. The aberration evaluation method according to claim 2, wherein in the evaluation step, the first and the second directions are decided based on the determination result in the determination step.

4. The aberration evaluation method according to claim 3, wherein in the evaluation step, the first or the second direction is set in the generating direction of the aberration.

5. The aberration evaluation method according to claim 1, wherein the periodical structure is formed by circles or regular polygons, and wherein the line width and the distance of the periodical structure are increased as a distance from the center is increased.

* * * * *